United States Patent [19]
Scheinberg

[11] Patent Number: 5,625,307
[45] Date of Patent: Apr. 29, 1997

[54] LOW COST MONOLITHIC GALLIUM ARSENIDE UPCONVERTER CHIP

[75] Inventor: Norman R. Scheinberg, South River, N.J.

[73] Assignee: Anadigics, Inc., Warren, N.J.

[21] Appl. No.: 845,293

[22] Filed: Mar. 3, 1992

[51] Int. Cl.$^6$ .......................... H03B 19/00; H01L 25/00; H04B 1/28
[52] U.S. Cl. .......................... 327/113; 327/122; 327/565; 455/333
[58] Field of Search .......................... 307/520, 529, 307/304; 365/194; 328/167, 156; 455/325, 326, 333; 333/4, 25, 119; 327/2, 39, 551, 552, 562, 563, 431, 436, 543, 168, 190, 304, 443, 579, 113, 122, 565

[56] References Cited

U.S. PATENT DOCUMENTS

| | | | |
|---|---|---|---|
| 2,815,406 | 12/1957 | Tongue | 179/171 |
| 3,111,636 | 11/1963 | Ma | 333/76 |
| 3,737,681 | 6/1973 | Rothermel | 327/168 |
| 4,242,595 | 12/1980 | Lehovec | 307/205 |
| 4,446,477 | 5/1984 | Currie et al. | 257/697 |
| 4,520,507 | 5/1985 | Moon | 455/3 |
| 4,532,543 | 7/1985 | Groenewegen | 358/86 |
| 4,569,084 | 2/1986 | Takahama | 455/131 |
| 4,677,692 | 6/1987 | Sakashita | 455/326 |
| 4,704,738 | 11/1987 | Graziadei et al. | 455/326 |
| 4,707,672 | 11/1987 | Duret et al. | 333/4 |
| 4,743,862 | 5/1988 | Scheinberg | 330/277 |
| 4,766,395 | 8/1988 | Dolby et al. | 330/284 |
| 4,792,987 | 12/1988 | Tumeo et al. | 455/131 |
| 4,864,162 | 9/1989 | Maoz | 327/543 |
| 4,884,039 | 11/1989 | King et al. | 330/253 |
| 4,893,035 | 1/1990 | Reynolds et al. | 307/520 |
| 4,939,387 | 7/1990 | Popek et al. | 307/529 |
| 4,963,773 | 10/1990 | Ayasli | 307/520 |
| 5,039,891 | 8/1991 | Wen et al. | 307/529 |
| 5,060,298 | 10/1991 | Waugh et al. | 455/326 |
| 5,083,050 | 1/1992 | Vasile | 307/304 |
| 5,140,198 | 8/1992 | Atherly et al. | 307/529 |
| 5,140,688 | 8/1992 | White et al. | 365/194 |
| 5,148,062 | 9/1992 | Goldfarb | 307/520 |
| 5,428,837 | 6/1995 | Bayruns et al. | 455/333 |

FOREIGN PATENT DOCUMENTS

| | | | |
|---|---|---|---|
| 0316999 | 5/1989 | European Pat. Off. | 455/326 |
| 0180411 | 7/1990 | Japan | 455/326 |

OTHER PUBLICATIONS

Washio, et al., "An All Band TV Tuner IC with On-Chip PLL", VLD 90-26, ICD 90-62.

Nagashima, et al., "A GaAs IC for TV Tuner", ED 87-155, pp. 15-24.

Evans, Arthur D., "Designing with Field-Effect Transistors", McGraw-Hill, pp. 237-239.

Gloeilampen, Philip's, "Balanced Voltage-Current Converter for Double-Balanced Mixer", Verwent Publications, Ltd., 1989.

(List continued on next page.)

*Primary Examiner*—David C. Nelms
*Assistant Examiner*—Trong Phan
*Attorney, Agent, or Firm*—Pennie & Edmonds

[57] ABSTRACT

A monolithic upconverter integrated circuit is described which performs the first frequency conversion of a dual conversion cable television (CATV) receiver. The upconverter chip includes three functional blocks: a Gilbert type image-rejecting mixer, a phase splitter, and a voltage-controlled oscillator. Mixing is performed by a novel Gilbert type mixer including image-rejection inductors to improve the noise figure of the mixer. A differential circuit topology allows the monolithic upconverter chip to utilize a plastic dual inline batwing package without considerable performance loss. On-chip RF bypass networks, in the form of series RC terminations, also help compensate for the undesirable effects of pin inductances in the dual inline package. A resistor-based DC biasing scheme dramatically reduces power-up latency, allowing faster testing.

25 Claims, 14 Drawing Sheets

OTHER PUBLICATIONS

Moon, Tae Hyung, "A High Performance VHF Solid-State TV Tuner".

H. Inamori, et al., "A 2GHz Down Coverter IC Fabricated by an Advanced Si Bipolar Process (DNP-III)", *IEEE Transactions on Consumer Electronics*, vol. 36, No. 3, 707–711 (1990).

N. Scheinberg, "A High Performance, Miniaturized X-Band Active Mixer for DBS Receiver Application with On-Chip If Noise Filter", IEEE Transactions on Microwave Theory and Techniques, vol. 38, No. 9, pp. 1249–1251, (1990).

Plas, et al., "A Novel Extended Dynamic Range Synchronous Detector For AM Shortwave Upconversion Receivers", IEEE Transactions on Consumer Electronics, vol. 35, No. 3, pp. 390–396 (1989).

Yamamoto, et al., "A Compact Satellite 1 GHz With GaAs ICs", IEEE Transactions on Consumer Electronics, vol. 35, No. 3, pp. 397–405 (1989).

Brady et al., "Development of a Monolithic FET Ka-Band Single Side Band Upconverter And Image Reject Downconverter", GaAs IC Symposium, pp. 189–192 (1989).

Scheinberg, et al., "An Accurat4e MESFET Model For Linear and Microwave Circuit Design", IEEE Journal of Solid–State Circuits, vol. 24, No. 2, pp. 532–539 (1989).

Tserng, "Monolithic Circuits Symposium", IEEE 1989 Microwave and Milimeter–wave, pp. 85–90, (1989).

West, et al., "Monolithic GaAs Blanking Upconverter", Conference Proceedings, 19th European Microwave Conference, pp. 725–730, (1989).

A. Yamamoto, "A Compact Satellite 1 GHz Tuner With GaAs ICs", ICCE Digest of Technical Papers, pp. 244–245, (1989).

T. Nakatsuka, et al. "A Low Distortion and Low Noise GaAs Mixer–Oscillator IC for a Double–Conversion TV Tuner", GaAs IC Symposium, pp. 161–164, (1988).

Wilson, et al. "Low Cost Downconverter For UK Demonstration of TV Distribution by Millimetrewaves", Conference Proceedings, 18th European Microwave Conferrence, pp. 457–462, (1988).

T., Nakatsuka, et al., "Low Distortion and Low Noise Oscillator Mixer IC for CATV Converters", GaAs IC Symposium, pp. 161–164, (1988).

A. Fazal, et al., "A Cell–Based Wideband Monolithic Upconverter", Conference Proceedings, 18th European Microwave Conference, pp. 753–758, (1988).

M. Pavio, et al., "A Distributed Double–balanced Dual–Gate Fet Mixer", GaAs IC Symposium, pp. 177–180, (1988).

Mizukami, et al., "A High Quality GaAs IC Tuner for TV/VCR Receiver", IEEE Transaction on Consumer Electronics, vol. 34, No. 3, pp. 649–652 (1988).

N. Scheinberg, "A Low–Frequency GaAs MESFET Circuit Model", IEEE Journal of Solid–State Circuits, vols. 23, No. 2, pp. 605–608 (1988).

P. Dautirche, "Session XVII:Analog Techniques", IEEE International Solid–State Circuits Conference, p. 216, (1987).

Larson, "An Improved GaAs MESFET Equivalent Circuit Model for Analog Integrated Circuit Applicstions", IEEE Journal of Solid–State Circuits, vol. SC–22, No. 4, pp. 567–574 (1987).

Mizukami, et al., "A High Quality GaAs IC Tuner For TV/VCR Receivers", IEEE Transactions on Consumer Electronics, vol. 34, No. 3, pp.649–659, (1988).

Fenk, et al., "TV VHF/Hyperband Tuner ICs", IEEE Transactions on Consumer Electronics, vol. CE–32, No. 4, pp. 723–733 (1986).

Makram–Ebeid, et al., "The Roles of The Surface and Bulk of the Semi–Insulating Substrate in Low Frequency Anomalies of GaAs Integrated Circuits", IEEE Transactions on Electron Devices, vol. ED–32, No. 3, pp. 632–642 (1985).

Müller, "A Double–Conversion Broad Band TV–Tuner With GaAS ICs", GaAs Symposium, pp. 97–100 (1984).

Taeuber, et al., "VHF Tuner IC For Use In Television Receivers And CATV Receivers", IEEE Transaction on Consumer Electronics, vol. CE–28, No. 4, pp. 508–518, (1982).

Lee, et al., "Carrier Injection and Backgating Effect in GaAs MESDET's", IEEE Electron Device Letters, vol. ED–3, No. 4, pp. 97–98, (1982).

LOW COST MONOLITHIC GALLIUM ARSENIDE UPCONVERTER CHIP

1. BACKGROUND OF THE INVENTION

1.1. Field of the Invention

The invention relates generally to the field of frequency conversion devices and in particular to gallium arsenide (GaAs) monolithic microwave integrated circuits (MMICs) therefor. More specifically, it relates to a low cost monolithic GaAs upconverter chip of the type used in a set-top cable television receiver.

1.2. Description of Related Art

Developments in GaAs monolithic microwave integrated circuit technology have made monolithic implementation of high frequency analog systems, such as cable television receivers and other radio receivers, the focus of considerable interest. The motivation for GaAs monolithic implementations is that such integration can lead to a considerable reduction in manufacturing cost and, sometimes, a performance improvement as well.

Reports of GaAs television tuner circuits appear in the literature. See, for example, Ducourant et al., "A 3 Chip Double Conversion TV Tuner System with 70 dB Image Rejection", *Proc. 1989 IEEE Symposium on Microwave and Millimeter-Wave Monolithic Circuits;* and, Mizukami et al., "A High Quality GaAs IC Tuner for TV/VCR Receivers", *IEEE Trans on Consumer Electronics,* August, 1988. These and other known circuits, however, suffer from various problems which diminish their performance and/or increase their cost relative to discrete component implementations of such devices as are in commercial use. Such problems include, for example: use of high-cost IC packaging technologies, requirements for too many off-chip components, demanding test procedures, excessive noise and/or distortion, and expensive fabrication technologies. These and other factors combine to preclude, so far, the development of effective, commercially advantageous realizations of GaAs tuner chips.

Four important factors which determine the ultimate manufacturing cost of any electronic system including a custom monolithic chip are: the number of external parts beyond the chip required to complete the system, the packaging cost of each chip, the testing cost (time/test), and the manufacturing yield (fraction of chips which can be sold, usually inversely proportional to the chip die area). Thus, a designer of a system which includes a custom monolithic chip will usually attempt to select a circuit topology that can be realized using the lowest cost chip package and the smallest number of off-chip components. In addition, since large value passive components, such as the inductors and capacitors conventionally used for filtering, can occupy a large fraction of the chip die area, circuit topologies which do not require such components are preferred in monolithic implementations where die area may significantly affect the yield and hence the cost of the chip. Finally, reduction of testing time is always useful in reducing the cost of any monolithic chip.

Upconverters, and frequency converters generally, typically include three basic functional blocks: an RF amplifier to amplify the RF input signal, a local oscillator (LO) to generate a LO signal, and a mixer to combine the RF input and LO signals to generate an intermediate frequency (IF) signal. With regard to RF input amplification and LO signal generation, prior art frequency conversion systems employ a variety of standard circuit topologies to implement these functions, the selection of which is typically determined merely by interfacing requirements for the intended application and the mixer topology used in the system. On the other hand, choice of a particular mixer topology is often critically important and may profoundly influence the ultimate performance of a frequency conversion system. Certain mixer circuits have particular advantages in terms of distortion, noise, and carrier suppression.

A class of mixers known as double balanced mixers exhibits excellent carrier suppression and low second order distortion. While good carrier suppression can also be achieved in non-double balanced mixers by the use of filters, such filters require large value inductors and capacitors which consume excess chip area. Thus, the double balanced mixer is well suited for monolithic integration since large area capacitors and inductors can be avoided.

The Gilbert type mixer, first described by Gilbert in 1969, is a double balanced mixer found in many integrated circuits and is well suited for use in a GaAs monolithic frequency converter. Although the Gilbert type mixer has excellent carrier suppression and low second order distortion, it suffers from high noise figure.

Mixer circuits which generate a product of input signals inherently produce an output signal containing a combination of two signals, an IF output signal and an IF image signal, both falling at the IF frequency. The IF output signal results from frequency translating the RF input signal to the IF frequency, and the IF image signal results from frequency translating the image signal to the IF frequency. The relationships among the IF, RF, LO and image frequencies for an upconverter are as follows:

FREQ(IF)=FREQ(LO)−FREQ(RF)

FREQ(IF)=FREQ(image)−FREQ(LO)

Thus, there are signals of two different frequencies at the input of the mixer (for a given LO frequency) that will become frequency translated to the IF frequency, the RF frequency and the image frequency.

It has been discovered that a major source of noise in the Gilbert type mixer originates from input noise at the image frequency, and that such noise can be substantially eliminated in the manner described herein. Gilbert type mixers comprise two tightly intertwined stages, (1) an RF amplifier stage which amplifies the RF input signal, and (2) a chopper (or mixer) stage which mixes the amplified RF input signal with a LO signal to generate the IF signal. Since all devices in electronic circuits inherently produce broadband noise, the RF amplifier stage will generate input noise to the chopper stage, and such noise includes components at both the RF and the image frequencies. It has been discovered that by filtering the input noise at the image frequency before it is frequency translated to the IF frequency, and thus unremovable by filtration, the overall noise figure of the mixer described herein can be substantially improved.

Conventionally, in non-differential circuits, an image-rejection filter placed between the output of the RF amplifier and the input to the mixer will attenuate noise at the image frequency presented to the input of the mixer. This prevents noise at the image frequency from contributing to and increasing noise at the IF frequency. Prior art Gilbert type mixers have not used such image-rejection filters because the output of the RF amplifier stage could not be separated from the chopper (mixer) stage, and thus a filter could not usefully be placed between the RF amplifier and the mixer. Placing the image-rejection filter at the input of the RF amplifier (rather than its output) will not have the desired effect since the RF amplifier itself generates noise at the image frequency. See, N. Scheinberg et al., "A high-performance, miniaturized X-band active mixer for DBS receiver application with on-chip IF noise filter", *IEEE Trans on Microwave Theory and Techniques*, September 1990, pp. 1249–1251.

Another important function of a receiver is to provide automatic gain control (AGC). The function of an AGC circuit is to adjust the gain of the receiver so that the IF output signal level remains relatively constant despite variations in the RF input signal level. This is typically accomplished by varying the gain of the RF input amplifier in response to changes in the RF input signal level.

A major problem with prior art AGC circuits is that they often introduce unwanted distortion. Conventionally, the AGC function was added to a Gilbert type mixer by replacing the source degeneration resistors with an AGC FET (MOSFET, MESFET, GASFET, etc.). This AGC FET acted as a voltage-controlled resistor whose drain-to-source resistance $R_{DS}$ varied with the voltage $V_G$ applied to the gate of the AGC FET. Since the gain of such a Gilbert type mixer depends on $R_{DS}$, the voltage $V_G$ at the gate of the AGC FET could be used to control the gain of the mixer.

A problem with these prior art AGC circuits is that the AGC FET resistance $R_{DS}$ is not only dependent on the gate voltage $V_G$, but also on the RF input voltage to the mixer and this latter dependence leads to increased distortion. Thus, there is a need for a low distortion AGC circuit compatible with a Gilbert type mixer but without the conventionally associated distortion problems.

A third problem associated with high frequency analog chips such as CATV upconverters is that such circuits have typically required specialized RF packages since the large pin inductances associated with standard plastic dual inline (DIP) packages would substantially degrade circuit performance. The prior art contains a number of monolithic GaAs CATV-related upconverter and downconverter circuits, most of which are packaged in conventional high cost RF packages. The cost of these packages can exceed the cost of the remainder of the chip, making many applications simply too costly (relative to existing discrete component circuits) to be commercially feasible as integrated circuits. There is thus a need for circuit topologies with reduced sensitivity to the parasitic inductances of low cost DIP packages.

Testing also represents a significant fraction of the manufacturing cost of any integrated circuit. GaAs integrated circuits have been known to exhibit anomalous behavior associated with back-gate transient swings, often governed by very long time constants, which may result in very long test times at significant cost.

Current theories regarding the back-gate effects in monolithic GaAs metal semiconductor field effect transistors (MESFETs) are described in the articles: "An Accurate MESFET Model for Linear and Microwave Circuit Design" by Scheinberg et al., *IEEE JSSC*, April 1989; "Carrier Injection and Backgating Effect in GaAs MESFET's" by Lee et al., *IEEE EDL*, April 1982; and "An Improved GaAs MESFET Equivalent Circuit Model for Analog Integrated Circuit Applications" by Larson, *IEEE JSSC*, August 1987, all of which are incorporated herein by reference.

2. SUMMARY OF THE INVENTION

The present invention provides a low cost monolithic GaAs upconverter chip of the type that could be employed, for example, in a set-top cable television receiver. (The term "chip" as used herein means a packaged chip, consistent with conventional usage.) Presently, such receivers generally employ more costly discrete part or hybrid upconverter devices. Recently, monolithic upconverter integrated circuits have been described in the literature, as previously recited. To date, however, most reported monolithic upconverter integrated circuits require the expensive RF packaging technology conventionally used to house comparable hybrid circuits and hence are not suitable for commercial television use.

In accordance with the invention, a monolithic GaAs upconverter chip is provided that is cabable of employing a standard low cost plastic DIP package. Conventionally, use of such plastic DIP packages for RF frequency conversion circuits has been extremely limited because the pins of these packages have considerable self-inductance, which degrades the performance of such circuits. To date, integrated circuits packaged in plastic DIP packages have been primarily limited to frequencies below the UHF range, thus constraining their use in CATV, cellular telephone, and other important RF applications. In accordance with the present invention, a differential circuit topology, including a novel image-rejecting mixer and special on-chip RF bypass networks, is used to overcome the pin inductance limitations of the low cost DIP package. Ancillary benefits of the differential circuit topology employed in the present invention include lower distortion, lower noise, and superior LO and spur rejection in comparison to similar single-ended circuits currently in use.

In the upconverter chip according to the present invention, image rejection is provided by two matched inductors integrated into a Gilbert cell mixer forming a novel Gilbert type image-rejecting mixer circuit. By filtering the input noise associated with the image frequency, this Gilbert type image-rejecting mixer prevents the image frequency noise from being frequency translated into the mixer's IF output signal. Thus, this Gilbert type image-rejecting mixer maintains the advantages of excellent carrier suppression and low harmonic distortion generally associated with such mixers without the conventionally associated disadvantage of high noise figure.

In accordance with the invention, a Gilbert type mixer may also include a novel AGC circuit, including a capacitively bootstrapped variable resistance circuit, which significantly reduces the second order distortion conventionally associated with use of AGC circuits in Gilbert type mixers. Alternative embodiments of the AGC circuit employing serial cascading of the variable resistance circuits may also be used to further improve overall linearity and further reduce distortion.

While monolithic integration and low cost packaging represent important cost savings in the upconverter chip of the present invention, still additional cost saving is achieved by employing a particular DC bias circuit for the GaAs MESFETs which reduces the required testing time. As previously mentioned, back-gate effects in GaAs integrated circuits are known to involve very long time constants. Such back-gate related transient effects can lead to very long power-up latencies (e.g., several seconds), which will substantially increase testing time and cost. The present invention includes a DC bias circuit which can dramatically reduce the undesirable power-up latency caused by back-gate transients. Using a preferred embodiment of the present invention, the power-up latency was reduced from several seconds to several milliseconds.

3. BRIEF DESCRIPTION OF THE DRAWINGS

The features of the present invention can be better understood with reference to the embodiments shown in the following drawings, in which.

Figure 1:
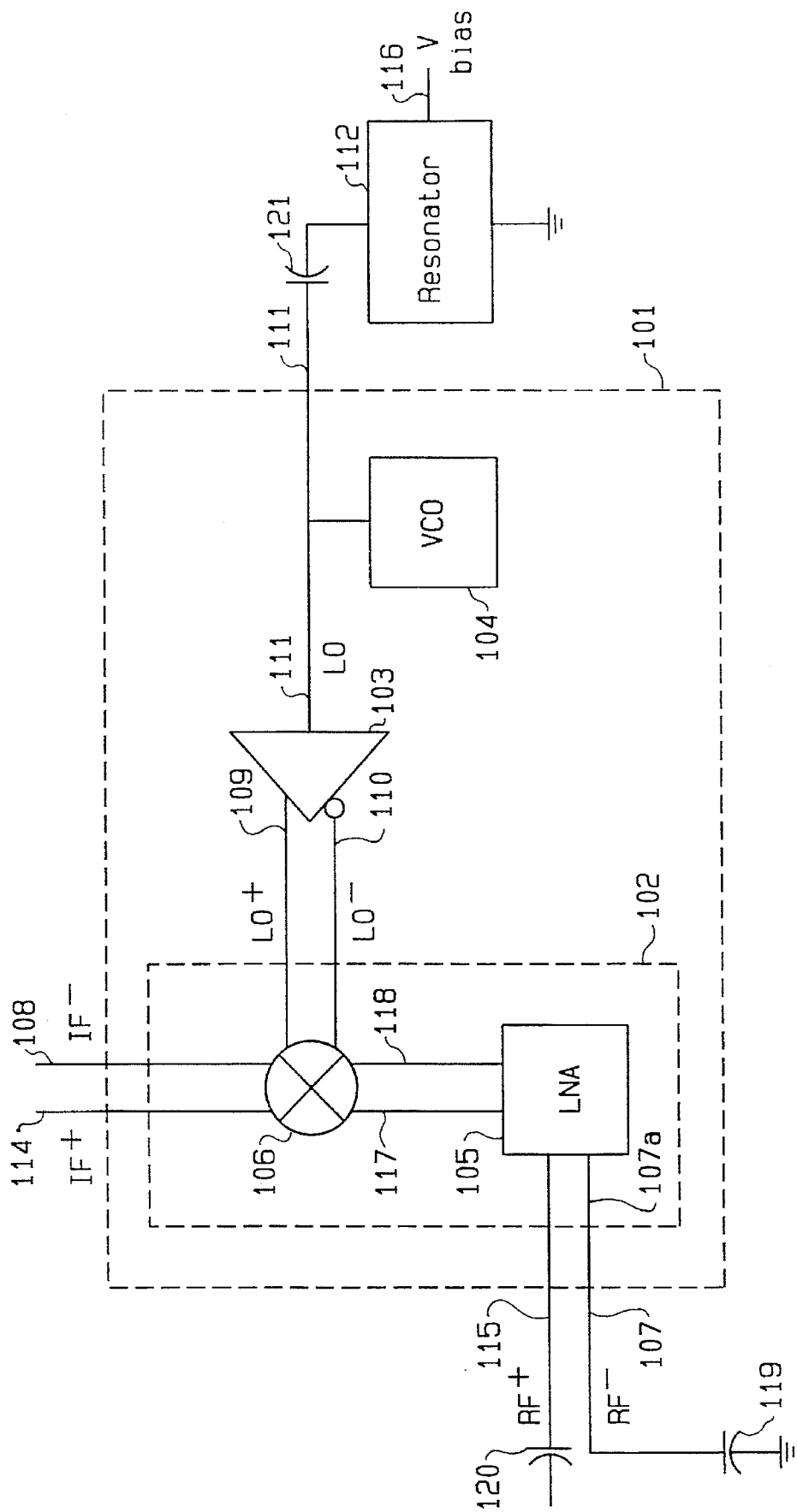
FIG. 1 is a functional block diagram of a preferred embodiment of a monolithic GaAs upconverter chip.
Figure 14:
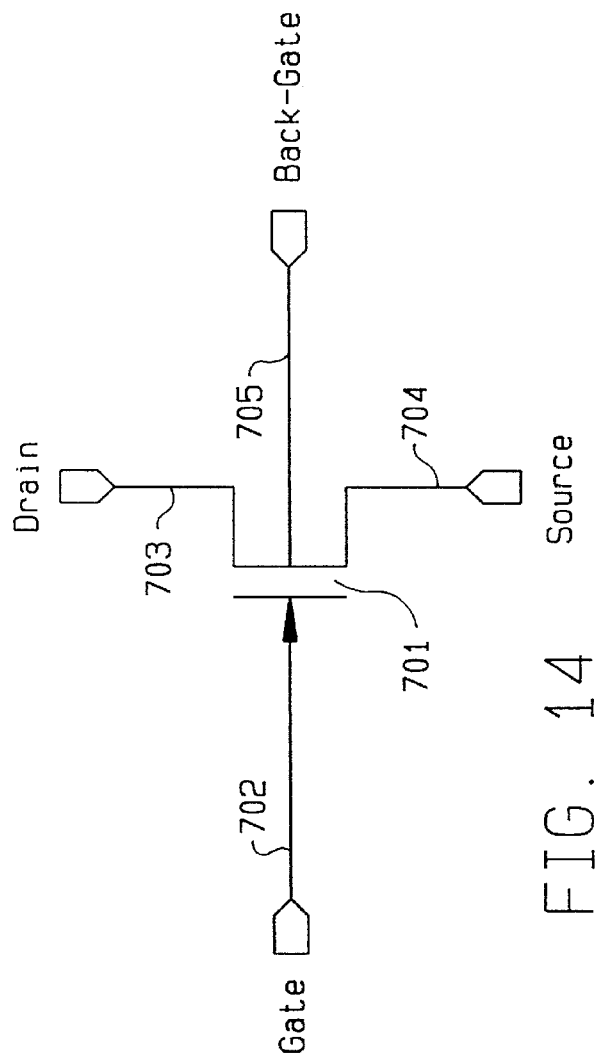
Figure 3A:
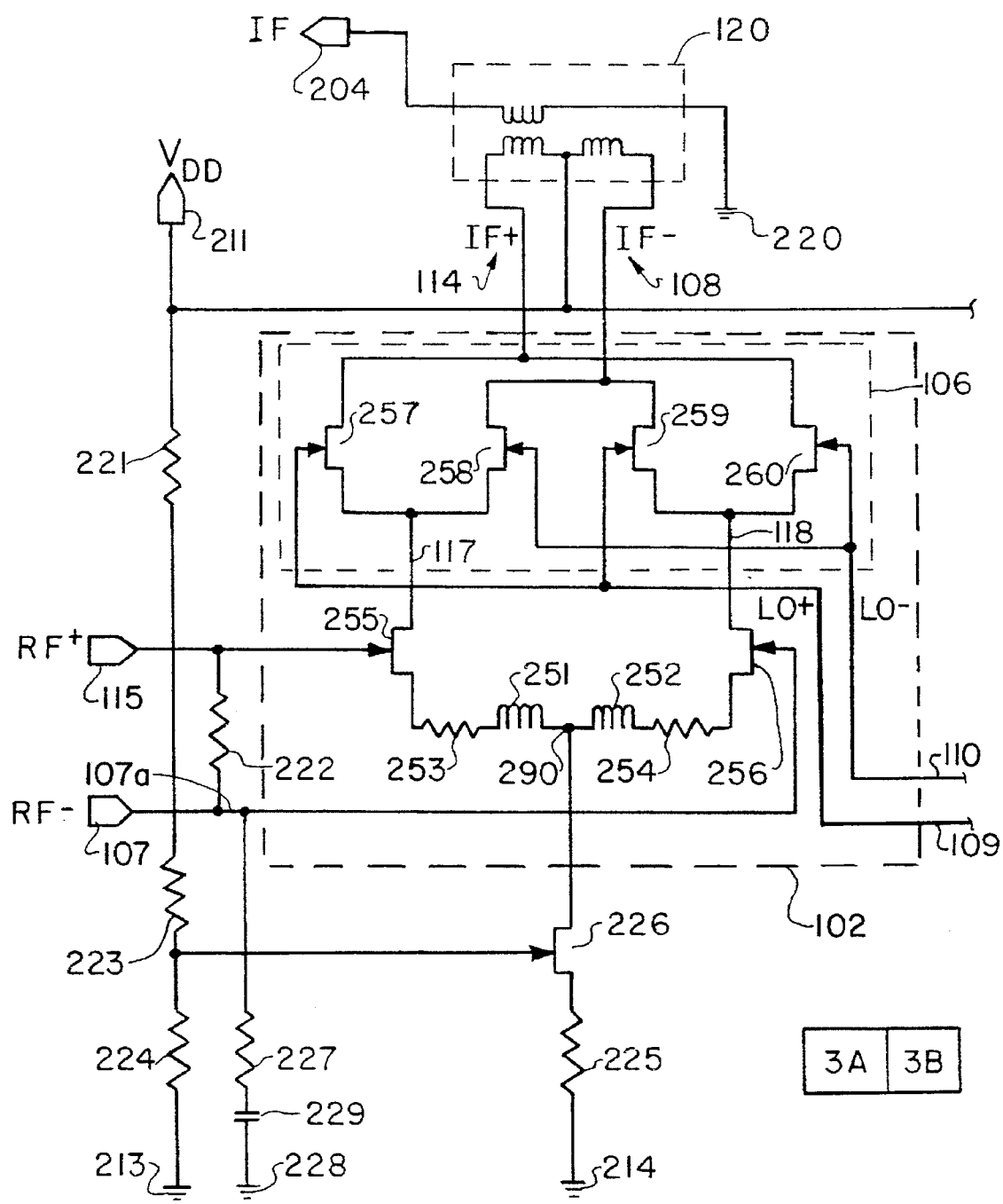
Figure 3B:
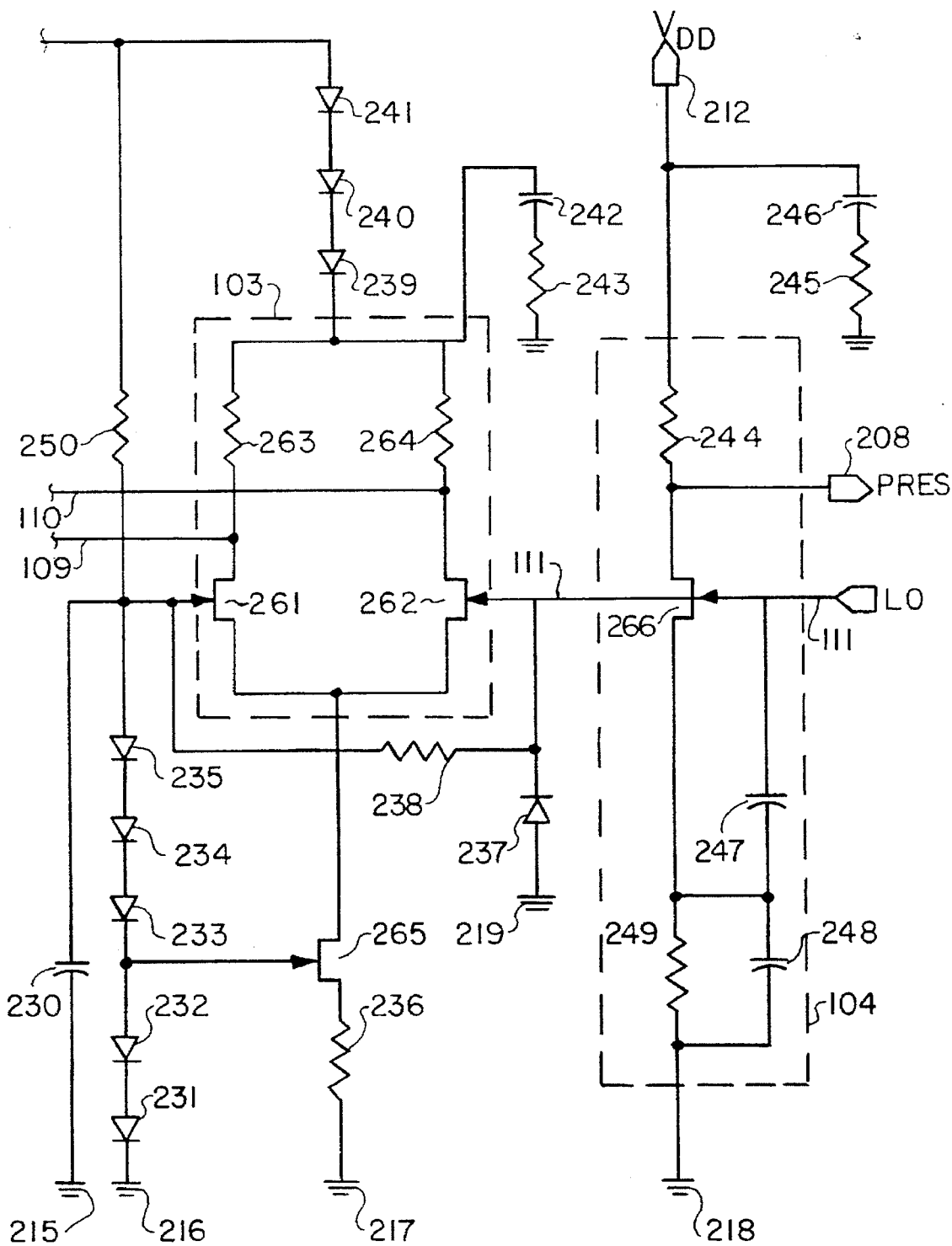
Figure 4:
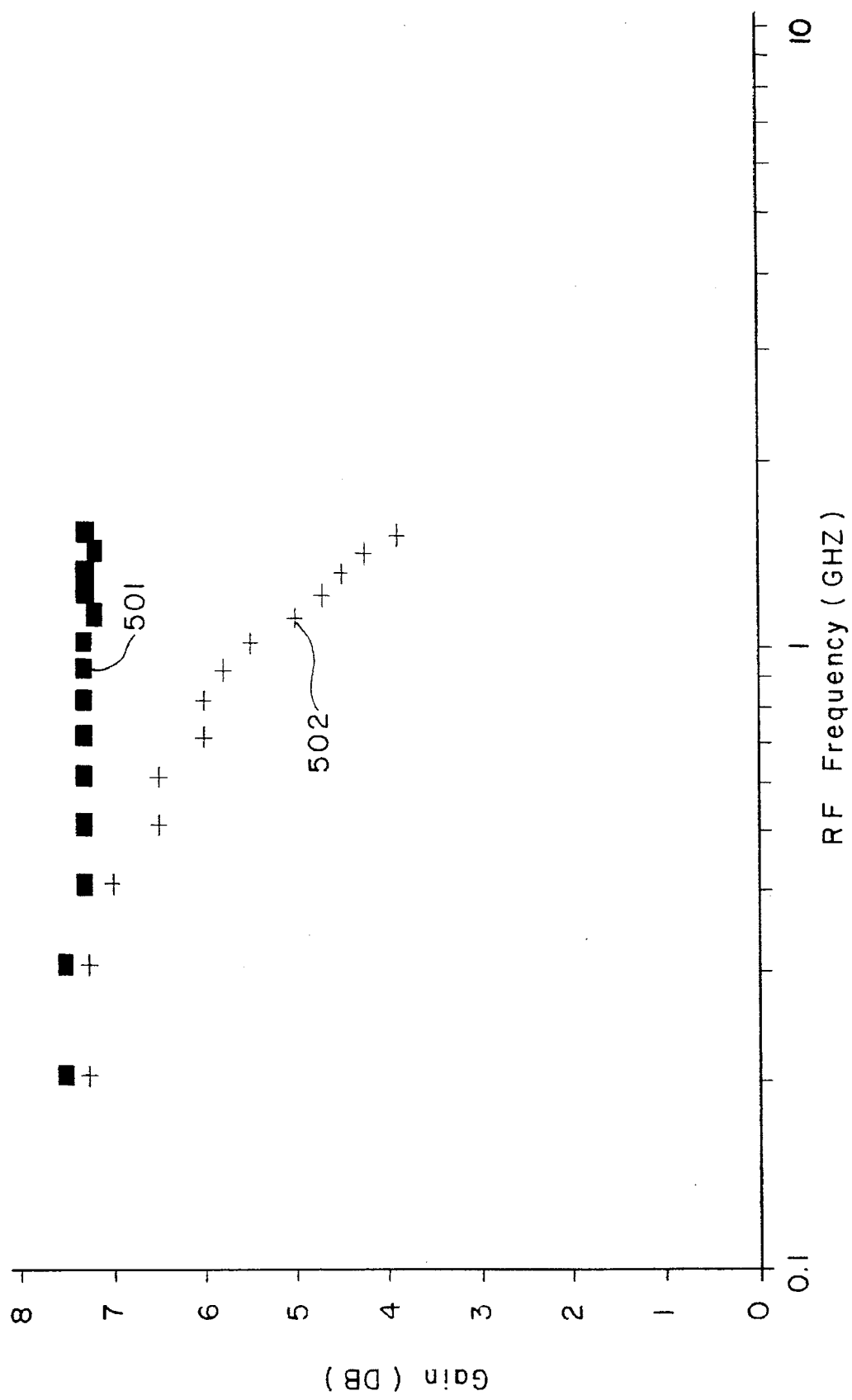
Figure 5:
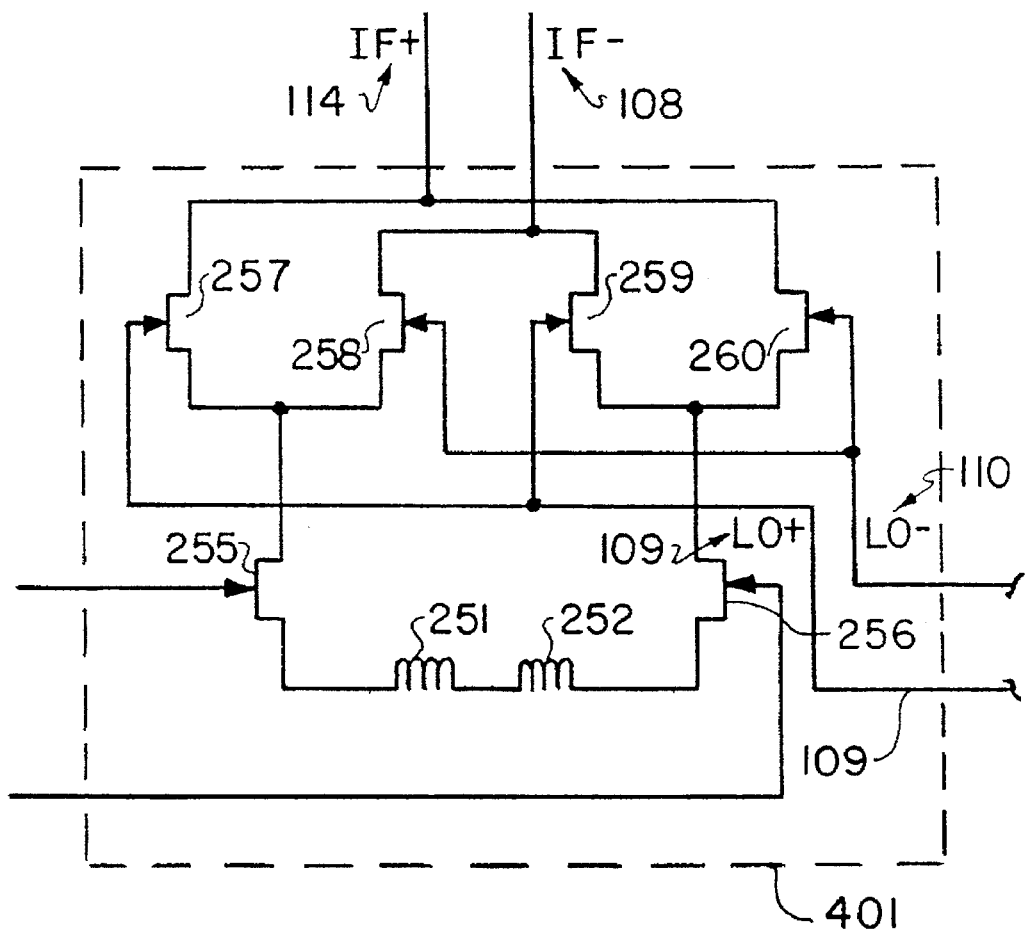
Figure 6A:
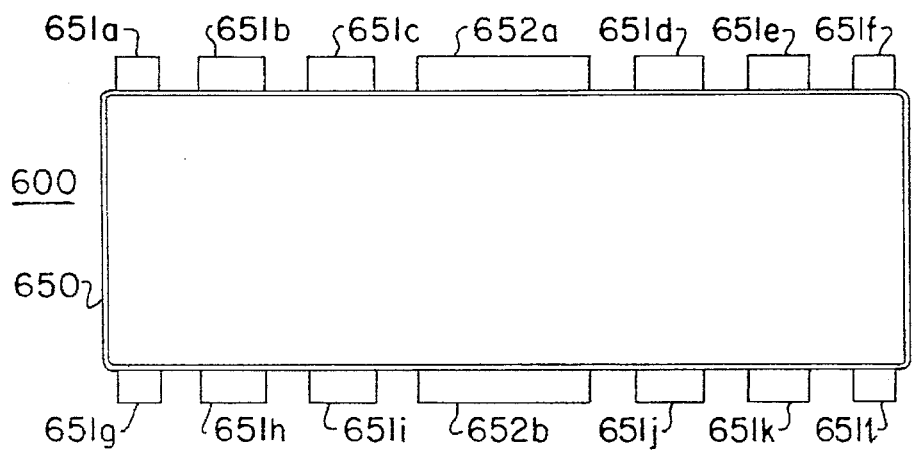
Figure 6B:
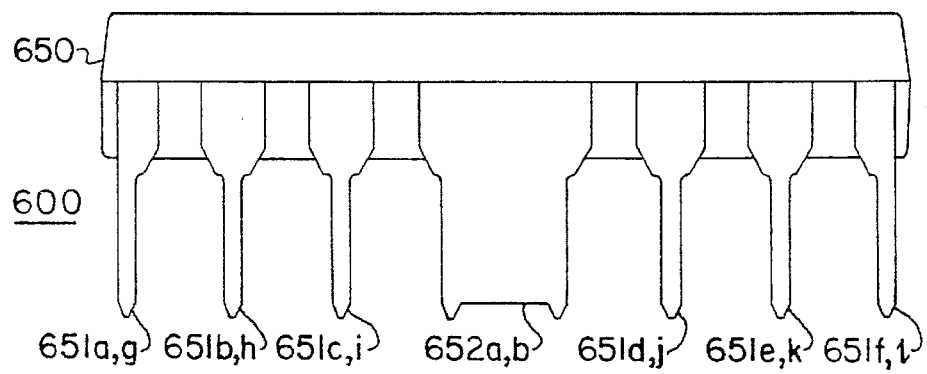
Figure 6C:
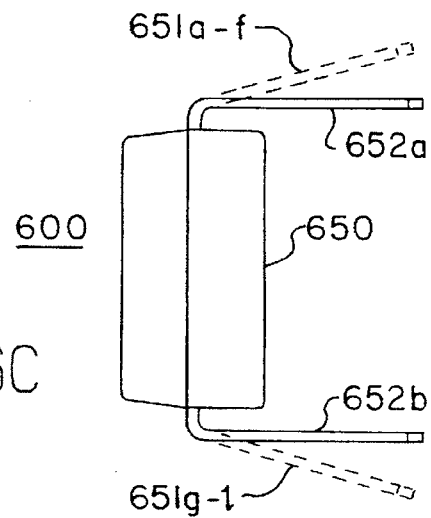
Figure 7:
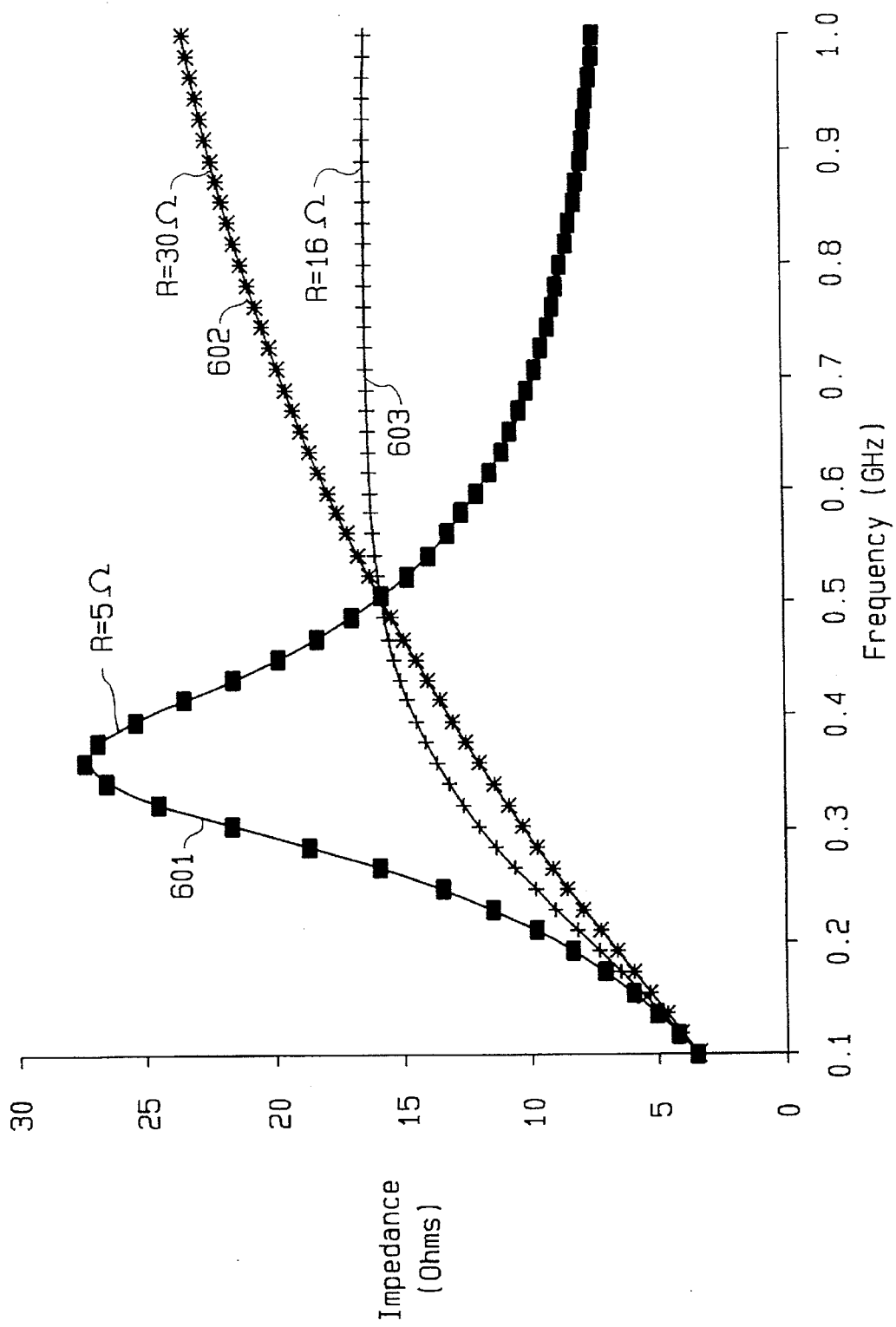
Figure 8:
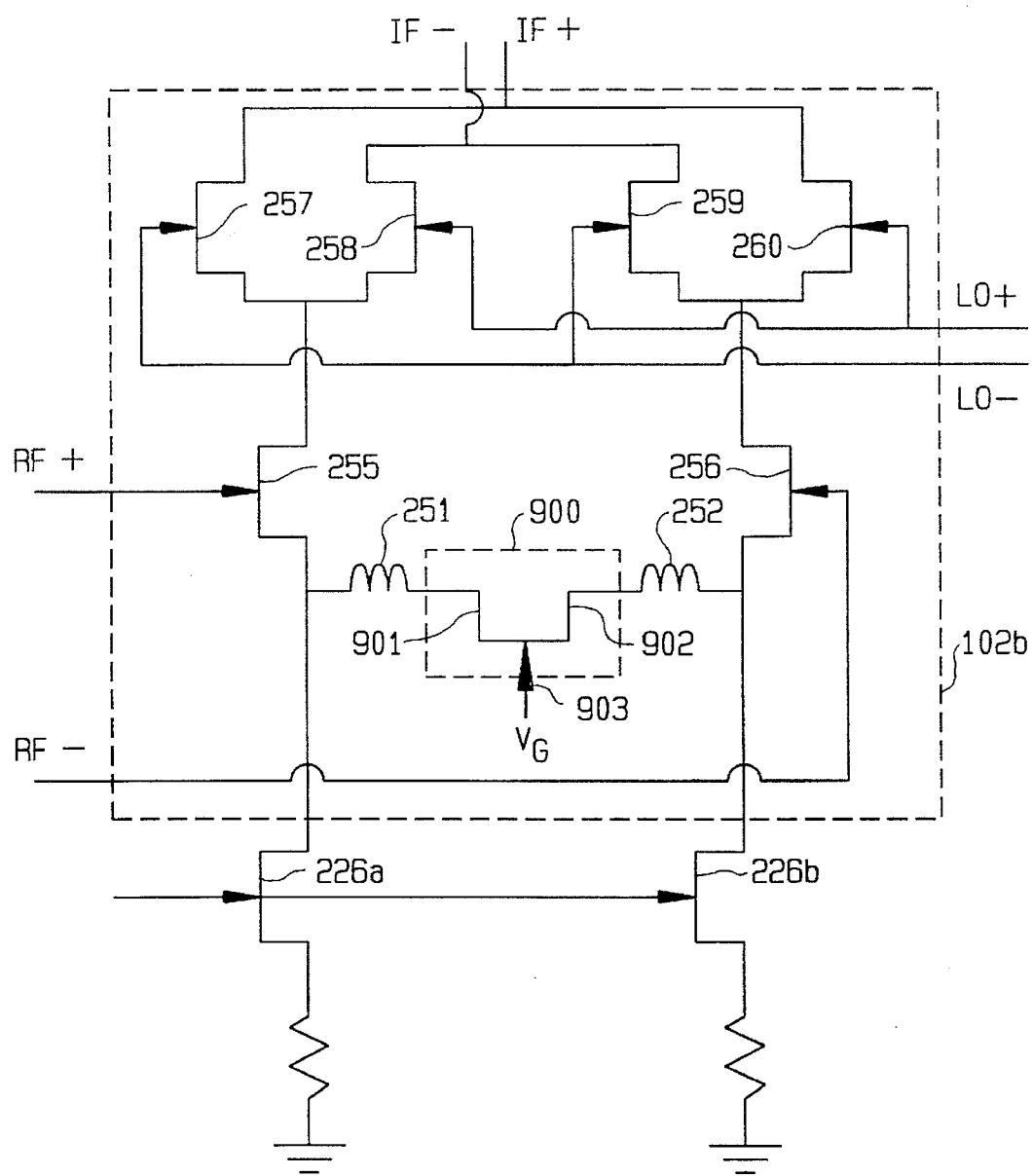
Figure 9:
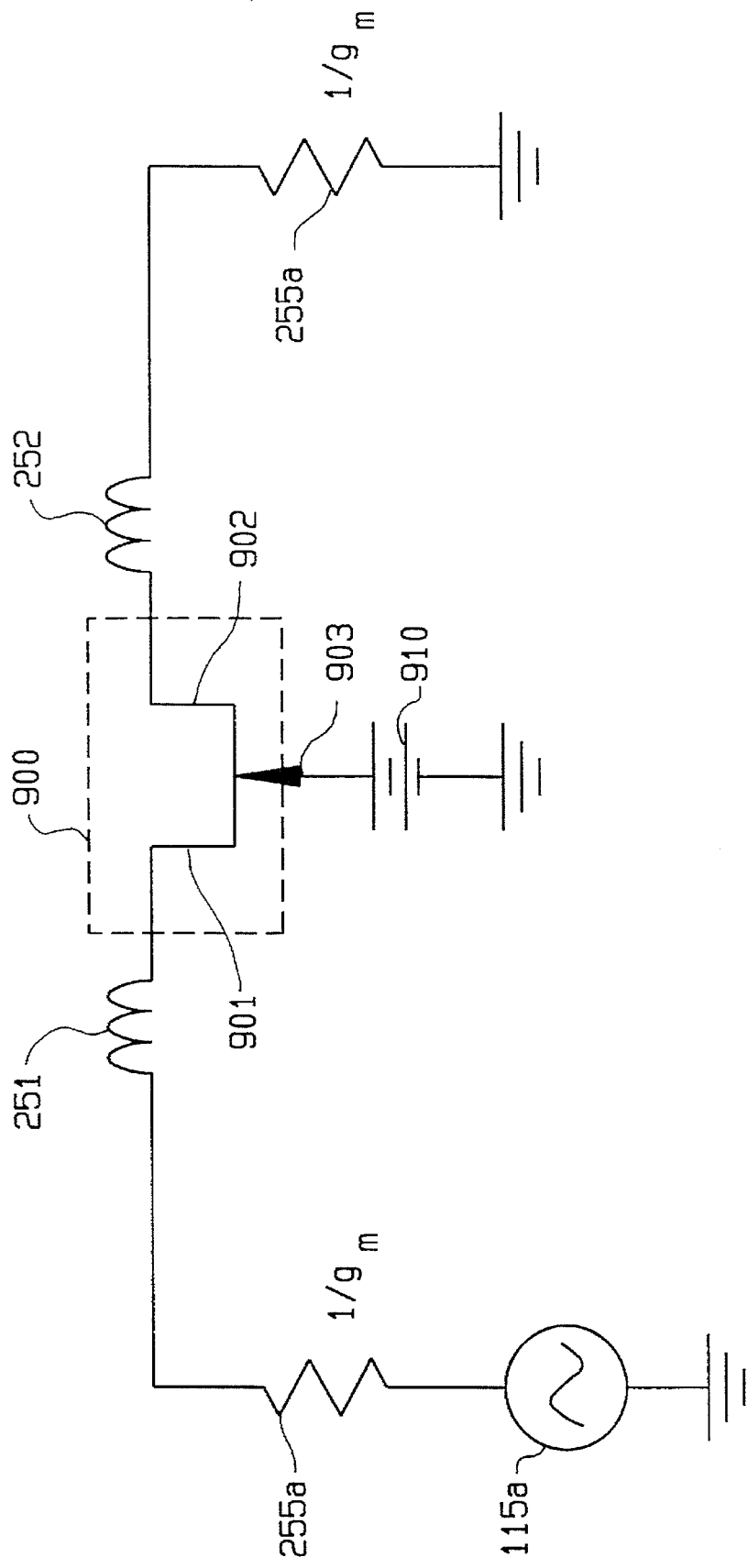
Figure 10:
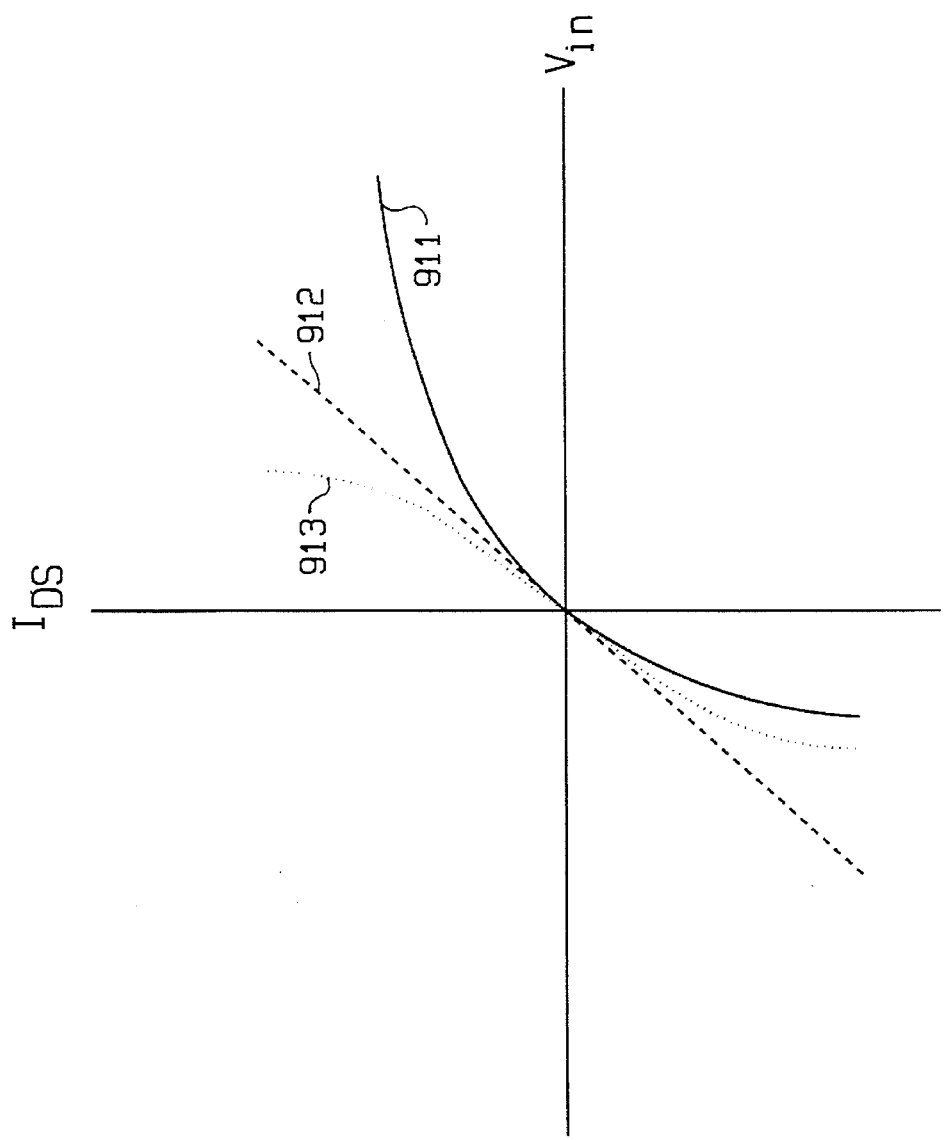
Figure 11:
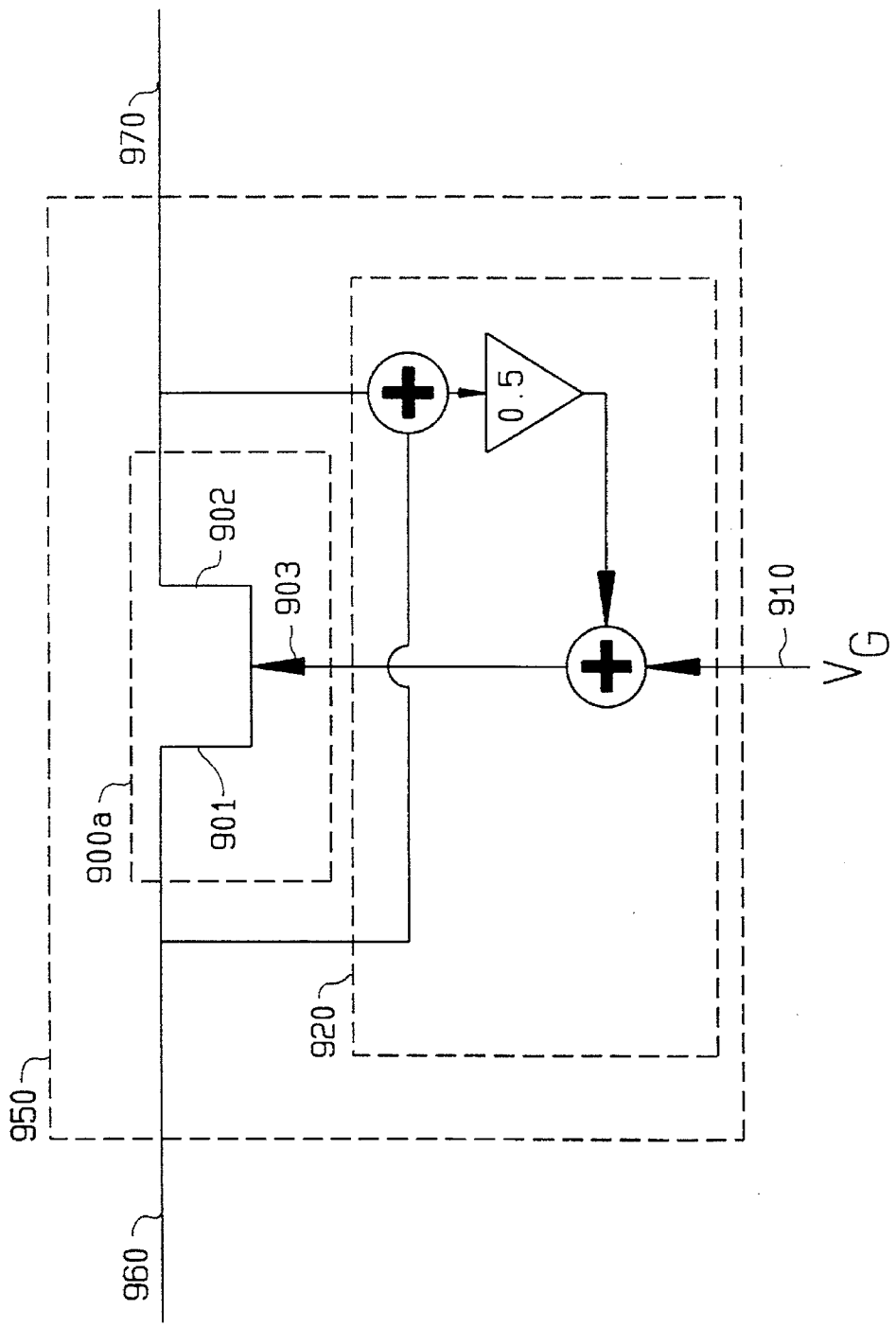
Figure 12:
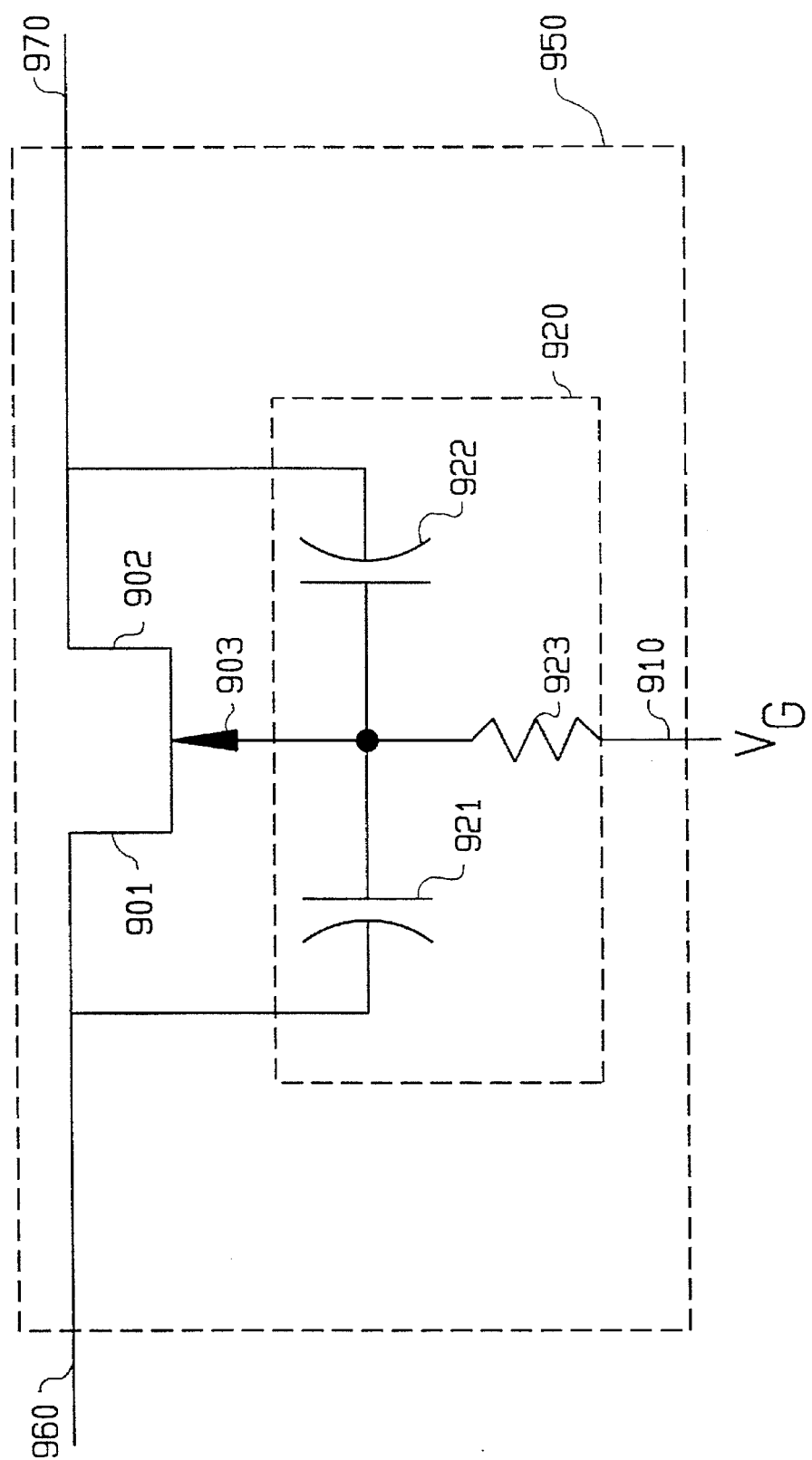
Figure 13:
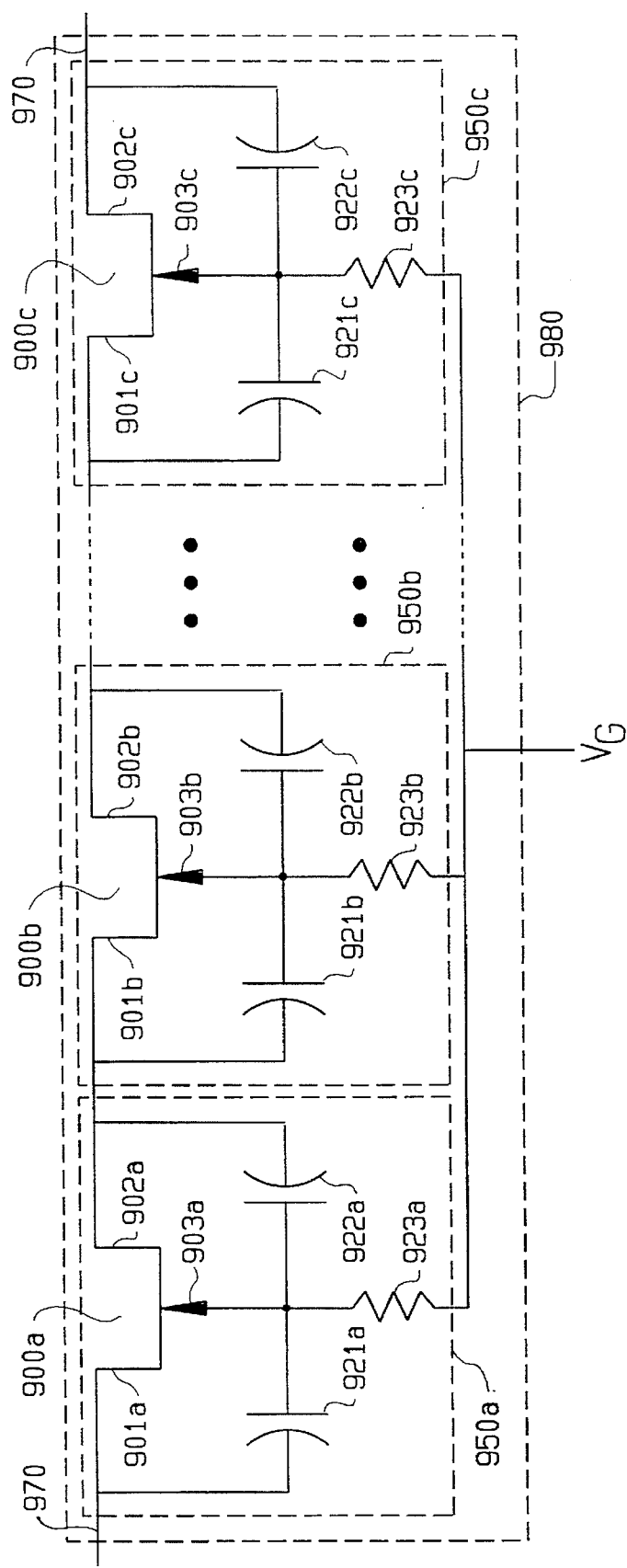

Combined FIGS. 3A and 3B are a detailed schematic diagram of the embodiment of FIG. 1;

FIG. 4 is a plot demonstrating the effect of the on-chip image-rejection inductors in the Gilbert type image-rejecting mixer of the upconverter chip;

FIG. 5 is a schematic diagram of an alternative embodiment of a Gilbert type image-rejecting mixer;

FIGS. 6A, 6B and 6C are drawings of three views of the plastic DIP package used in the preferred embodiment of the upconverter chip shown in combined FIGS. 3A and 3B;

FIG. 7 is a plot illustrating the effect of alternative parameter choices in an RF bypass network attached to one of the RF input terminals in the preferred embodiment of the upconverter chip shown in combined FIGS. 3A and 3B;

FIG. 8 is a schematic diagram of the Gilbert type mixer of FIG. 5 with an added AGC FET;

FIG. 9 is a schematic diagram of a small signal equivalent circuit representing the AGC portion of the mixer of FIG. 8;

FIG. 10 is a plot showing the transfer characteristics of the AGC FET in FIG. 9, along with two alternative transfer characteristics for illustrative purposes;

FIG. 11 is a system diagram of a system for realizing an AGC circuit with an odd-symmetric transfer characteristic;

FIG. 12 is a schematic diagram showing a practical circuit implementation of the odd-symmetric AGC circuit of FIG. 11 using capacitive bootstrapping;

FIG. 13 is a schematic diagram showing an alternative embodiment of the AGC circuit using multiple odd-symmetric AGC FETs to achieve better linearity;

FIG. 14 shows a GaAs MESFET with four terminals, including an implicit back-gate terminal.

4. DETAILED DESCRIPTION OF THE INVENTION

4.1. Preferred Embodiment

FIG. 1 is a block diagram of a preferred embodiment of the upconverter chip 101 of the invention which comprises a Gilbert type image-rejecting mixer 102, a phase splitter 103, a voltage-controlled oscillator 104 and five external signal ports 107, 115, 114, 108 and 111. Upconverter chip 101 mixes a differential RF input signal applied at ports 115 and 107 with a single-ended LO signal at port 111 to generate a higher frequency differential IF output signal at ports 114 and 108. In the preferred embodiment, the differential RF input signal applied to terminals 115 and 107 is realized by AC grounding terminal 107 (through bypass capacitor 119) and applying single-ended RF input at terminal 115. Thus, the "differential" RF input signal applied at terminals 115 and 107 includes both substantial common-mode and differential-mode components. (Alternative embodiments in which a primarily differential-mode RF input signal is coupled to ports 115 and 107 are clearly feasible and are considered within the scope of the present invention.) The single-ended LO signal at port 111 is generated by the interaction of the on-chip voltage-controlled oscillator 104 and an external resonator 112. A DC voltage applied to resonator 112 at terminal 116 controls the frequency of the single-ended LO signal at port 111. The phase splitter 103 transforms the single-ended LO signal at port 111 into a differential LO signal at internal nodes 109 and 110.

The Gilbert type image-rejecting mixer 102 comprises a differential low noise amplifier 105 and a chopper 106. Mixer 102 has an RF input port 107a which is connected to the upconverter RF input port 107. The differential low noise amplifier 105 receives input from the differential RF input signal at ports 115 and 107, amplifies and filters image frequency noise from the differential RF input signal, and couples the amplified differential RF signal to chopper 106 through terminals 117 and 118. Because of the common-mode rejection of low noise amplifier 105, the amplified differential RF signal at terminals 117 and 118 will be largely differential-mode. Chopper 106 receives differential RF input from low noise amplifier 105 through terminals 117 and 118, differential LO input via internal nodes 109 and 110, and mixes these signals to generate the differential IF output signal at ports 114 and 108.

4.2. Frequency Bands of Preferred Embodiment

Figure 2:
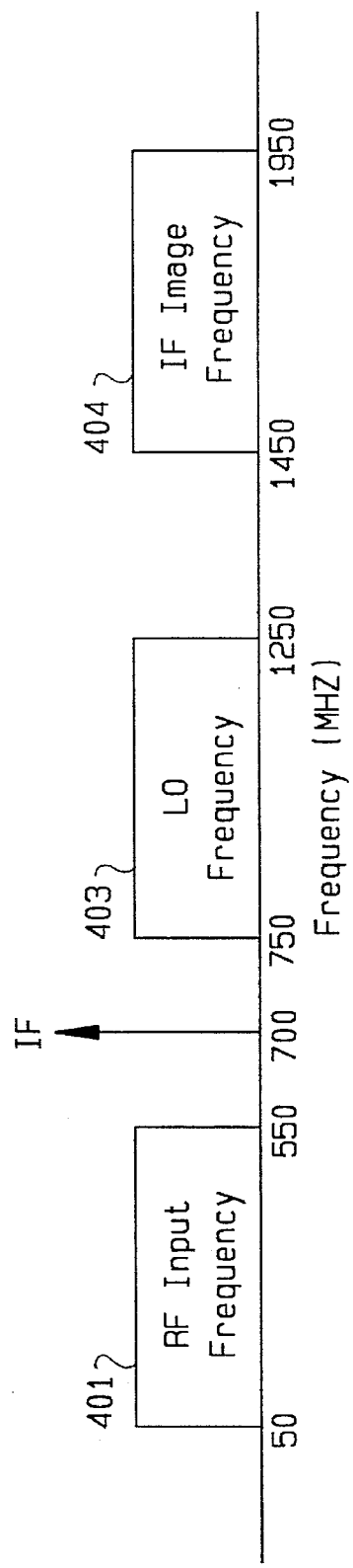
FIG. 2 depicts the frequency bands for the RF, IF, LO, and image signals in the upconverter chip of FIG. 1.

FIG. 2 depicts the frequency bands for the RF, image and LO input signals entering the upconverter and the IF output signal generated by the upconverter. As illustrated in FIG. 2, upconverter chip 101 is used to upconvert a differential RF input signal, applied at ports 115 and 107 (by AC grounding one of the input terminals or by appling active differential input to both terminals), in the frequency range of 50 to 550 MHz to a differential IF output signal, output through ports 114 and 108, at a frequency of 700 MHz by mixing with a differential LO input signal, applied through internal nodes 109 and 110, in the frequency range of 750 to 1250 MHz which is designated as LO Frequency Range 403 in FIG. 2. In addition, the differential IF output signal generated at ports 114 and 108 includes noise which is frequency translated from the image frequency in the range of 1450 to 1950 MHz, which is designated in FIG. 2 as IF Image Frequency Range 404. In accordance with the invention, the magnitude of this image component noise is attenuated by the Gilbert type image-rejecting mixer 102, thereby reducing the overall noise figure of the mixer.

4.3. Off-Chip Components

For use with this preferred embodiment of the invention, a small number of off-chip discrete parts are required to form a fully operational system. They include: by-pass capacitor 119 (FIG. 1) for AC grounding input port 107; DC blocking capacitors 120 for port 115 and 121 for port 111 (FIG. 1); a varactor and associated bias circuitry for tuning (shown as resonator 112 of FIG. 1); and, a baluns 120 (FIG. 3A) for converting the differential IF output signals IF$^+$ 114 and IF$^-$ 108 to a single-ended output signal.

4.4. Gilbert Type Image-Rejecting Mixer

Combined FIGS. 3A and 3B illustrate the detailed circuitry of this preferred embodiment. Mixer 102, the block structure of which is explained above, is a novel Gilbert type image-rejecting mixer circuit. Mixer 102 operates similarly to a standard four quadrant Gilbert variable transconductance multiplier cell. Modulators employing such Gilbert Cells are discussed, for example, in the book *Bipolar and MOS Analog Integrated Circuit Design* by A. Grebene. In mixer 102, GaAs MESFETs 255, 256, 257, 258, 259 and 260 are used instead of the conventional npn bipolar transistors or MOSFETs and function in part analogously. In accordance with the invention, MESFETs 255 and 256, resistors 253 and 254, and inductors 251 and 252 form a frequency selective differential amplifier balanced across virtual ground node 290, which attenuates the high frequency noise at the image frequency. In addition, the differential circuit architecture which includes virtual ground node 290 also helps reduce the sensitivity to the parasitic inductances of the package pins feeding ports 107 and 115.

Source degeneration resistors 253 and 254 linearize the gain of MESFETs 255 and 256. Unfortunately, the larger the resistance of resistors 253 and 254, the larger the amplifier noise figure. Since the noise figure is difficult to model, a compromise value of 8 Ohms was chosen for resistors 253 and 254 in the embodiment depicted based on actual noise figure and distortion measurements of several test chips.

Previously, Gilbert type mixers have not included image-rejection filters because it was not possible to clearly separate the RF amplification and chopping (mixing) stages in a manner such that one could insert a filter between the stages. In accordance with the present invention, it was discovered these filters could be disposed as source-degenerating elements and implemented as inductors (251 and 252 in FIG. 3A, for example).

To fully appreciate the constraints involved in the design of an image-rejecting Gilbert type mixer in accordance with the present invention, it is useful to carefully examine and model the sources of noise in the Gilbert Cell. The noise current ($I_N$) generated by the FETS in the RF amplifier section of a Gilbert Cell (MESFETS 255 and 256 in FIGS. 3A and 5) obeys the following proportionality relation:

$$I_N \alpha \sqrt{\frac{1}{\frac{1}{g_m} + Z}} \qquad (1)$$

where:

$g_m$ is the transconductance of the FET (MESFET 255 or 256); and

Z is the impedance in series with the sources of the FETs.

The voltage gain $G_v$ of the Gilbert type mixer obeys the following proportionality relation:

$$G_v \alpha \frac{1}{\frac{1}{g_m} + Z} \qquad (2)$$

where $G_v$ is the ratio of the IF output signal to the RF input signal.

In accordance with the invention, Z may be chosen to be an inductor (with impedance Z=ωL, such as inductors 251 and 252 in the embodiment of FIG. 5). If Z is an inductor with inductance L, the proportionality relations for $I_N$ and $G_v$ as a function of frequency are as follows:

$$|I_N(\omega)| \alpha \sqrt{\sqrt{\frac{1}{\left(\frac{1}{g_m}\right)^2 + (\omega L)^2}}} \qquad (3)$$

$$|G_v(\omega)| \alpha \frac{1}{\sqrt{\left(\frac{1}{g_m}\right)^2 + (\omega L)^2}}$$

In accordance with the invention, inductance L (of inductors 251 and 252 in FIG. 5, for example) is preferably chosen so that ωL<1/$g_m$ (the $g_m$ being that of MESFETs 255 and 256) at the RF frequency. When so chosen, the gain (at the RF frequency) will remain largely unaffected by the presence of the inductors, as demonstrated by the equation for $G_v$. In further accordance with the invention, a value for L may be selected which also satisfies the condition ωL>1/$g_m$ at the image frequency. This assures that image noise will be attenuated by the presence of the inductors, as shown by the equation for $I_N$. The above conditions can always be satisfied in an upconverter because the image frequency is higher than the RF frequency. Thus, for a Gilbert type mixer used in an upconverter, the added inductors will reduce the noise more than they will reduce the RF signal, and thus the noise figure of the mixer will be improved by the addition of the inductors.

An added benefit of the new image-rejecting Gilbert type mixer circuits in accordance with the invention (shown in FIGS. 3A and 5) is that the condition for image noise rejection, Z>1/$g_m$ at the image frequency, can be met with a small value inductor because 1/$g_m$ is always made as small as possible to achieve high gain. This is useful, since only small values of inductance are realizable in an integrated circuit.

In accordance with the invention, Gilbert type image-rejecting mixer 102 differs from conventional Gilbert type mixers by the addition of matched inductors 251 and 252. Inductors 251 and 252, together with resistors 253 and 254 and MESFETs 255 and 256, function as a balanced, single pole, low-pass image-rejection filter. The pole of this filter is located at the frequency at which the sum of the resistance looking into the source of MESFET 255 or 256 and the resistance of resistor 253 or 254 is equal to the reactance of inductor 251 or 252. Thus, the inductance of the required inductors is very small and inductors 251 and 252 can be implemented on-chip without requiring excessive die area.

FIG. 4 shows the effect of the addition of inductors 251 and 252 (FIG. 3A) on the frequency response of the Gilbert type image-rejecting mixer 102. FIG. 4 is a plot of the gain, $G_v$, between the differential IF output signal at ports 114 and 108 and the differential RF input signal at ports 115 and 107 as a function of RF frequency. In the absence of inductors 251 and 252, the conventional Gilbert type mixer exhibits an essentially flat response beyond 2 GHz, as shown by trace 501 in FIG. 4. With the addition of inductors 251 and 252, a one pole roll-off in the frequency response of mixer 102 occurs at approximately 0.80 GHz, as shown by trace 502; this assures that any noise at the image frequency (1450–1950 MHz) will be attenuated relative to the desired signal, which lies in the 50–550 MHz range.

FIG. 5 is a schematic diagram of an alternative embodiment 401 of mixer 102 which does not include source degeneration resistors 253 and 254. Mixer 401 will have increased gain but poorer linearity than mixer 102. For mixer 401, the single pole gain roll-off will occur at the frequency where the impedance looking into the source of MESFET 255 or 256 is the same magnitude as the impedance of inductor 251 or 252.

In accordance with the invention, alternative embodiments (not shown) of the Gilbert type image-rejecting mixer may be realized by replacing the MESFETS in the embodiments shown in FIGS. 3A or 5 with compatibly chosen MOSFETs, bipolar transistors, or other devices, all of which are considered within the scope of the present invention.

The Gilbert type image-rejecting mixer topologies employing matched source-degenerating inductors 251 and 252 as shown in FIGS. 3A and 5 are ideally suited for monolithic implementation. The high degree of component and parasitic matching achievable through monolithic integration and careful symmetric layout is significant in eliminating second order distortion. The Gilbert type image-rejecting mixers 102 and 401 in accordance with the present invention enjoy the many distortion and feedthrough advantages of Gilbert type mixer topologies generally, while simultaneously improving noise figure by eliminating image noise from the IF output.

4.5. Phase Splitter

The preferred embodiment shown in combined FIGS. 3A and 3B advantageously includes a phase splitter 103 to convert the single-ended LO signal at port 111 to the differential LO signal applied to the chopper 106 of mixer 102 via internal nodes 109 and 110. In the preferred embodiment shown, phase splitter 103 preferably comprises a limiting differential amplifier. It includes a source-coupled pair driver stage (MESFETs 261 and 262) and a resistive load stage (resistors 263 and 264). Load resistors 263 and 264 can be varied to change the output impedance at internal nodes 109 and 110, which should be low enough to avoid being overloaded by the input capacitance of the MESFETs 257–260 of chopper 106 at high frequencies. Values of 100 Ohms were chosen for resistors 263 and 264, based on the aforementioned impedance consideration as well as power consumption considerations. The bias current in phase splitter 103 is preferably chosen so that the differential amplifier will operate in a limiting mode, as is known in the art. Other bias elements, such as diodes 239–241, 231–235 and resistor 236, provide appropriate DC bias levels for phase splitter 103.

Input to phase splitter 103 originates from the single-ended LO signal at port 111, which is fed directly to the gate of MESFET 262 while the other phase splitter input (gate of MESFET 261) is AC grounded by capacitor 230. Phase splitter 103, by virtue of its high common-mode rejection ratio, effectively converts the single-ended LO input signal at port 111 to a differential output signal at internal nodes 109 and 110 which contains a very small AC common mode component, thus helping to suppress LO feedthrough in mixer 102.

4.6. Voltage-Controlled Oscillator

The preferred embodiment shown in FIGS. 3A and 3B also includes a voltage-controlled oscillator 104 which, in combination with an external resonator 112 (shown in FIG. 1), generates the single-ended LO signal at port 111. The oscillator circuit formed by MESFET 266 and capacitors 247 and 248 comprises the well known Clapp oscillator topology. In accordance with the invention, the Clapp topology is preferably used to allow one end of the off-chip resonator 112, which would include a varactor and appropriate bias circuitry, to be grounded so that only a single pin is required to connect it to the oscillator, thereby minimizing packaging complexities and cost. In the oscillator shown, resistor 238 in the bias path of the gate of MESFET 266 sets the gate bias for the MESFET. Resistor 238 is preferably kept large, so as not to affect the "Q" of voltage-controlled oscillator 104. Resistor 249 sets the bias current in MESFET 266 to ¼ IDSS, an optimum point (as is well known) for maintaining high $g_m$ at minimum current. Low bias current in oscillator 104 is desirable not only for low power consumption, but also for low phase noise. Diode 237 conducts in order to prevent the gate of MESFET 266 from dropping significantly below ground potential during transient conditions. Port 208 can be advantageously used to drive external phase locking circuitry or for other purposes, as may be desired.

In voltage-controlled oscillator 104, the sum of the capacitance of capacitors 247 and 248 and the off-chip resonator (varactor) capacitance at port 111 represents the total capacitance in a resonant circuit also including the off-chip inductance consisting essentially of the sum of the chip package pin inductance, the varactor inductance, and the varactor pin inductance.

4.7. Low Cost Package

FIGS. 6A, 6B and 6C show three views of a low cost plastic DIP package used in accordance with the invention for the upconverter chip. Package 600 comprises a plastic body 650 and pins 651a–l and 652a–b. Pins 652a–b are advantageously made as batwing pins 652a–b (so-called because of their shape), each of which combines two standard pins 651 and conventionally is used to increase heat dissipation from the package.

Package 600 and similar low cost plastic DIP package technologies have the undesirable property of large pin inductances, on the order of 5 nH, which in the past has greatly limited use of relatively inexpensive plastic DIP packages for RF applications. In accordance with the present invention, use of the balanced Gilbert type mixer topology 102 helps to mitigate the negative effects of parasitic DIP package pin inductances.

4.8. RF Bypass Networks

Additionally, to further reduce the sensitivity to parasitic pin inductance, several on-chip passive RF bypass networks, each comprising a resistor and a capacitor in series, are connected between on-chip ground points and various pins. These dampen potential resonances of the upconverter that would otherwise occur due to pin inductances. In the preferred embodiment of the present invention shown in FIGS. 3A and 3B, resistor 245 and capacitor 246, resistor 243 and capacitor 242, and resistor 227 and capacitor 229 each represent such passive RF bypass networks.

For purposes of explanation, consider the RF bypass network in FIG. 3A which includes resistor 227 and capacitor 229. Good mixer performance requires that internal node 107a, which provides an AC ground at the gate of MESFET 256, must maintain a low impedance to ground over the range of signal frequencies present in the upconverter. If, at a particular frequency, the impedance to ground at node 107a becomes too large, the upconverter will not perform well at that frequency.

In accordance with the invention, the resistance R of resistor 227 and the capacitance C of capacitor 229 are chosen to compensate for the effects of the package pin inductance L (the series inductance to the off-chip ground). Typically, the values of C and L are constrained largely by the integrated circuit and packaging technologies, respectively. In accordance with the invention, resistance R is preferably determined by the following equation:

$$R = \sqrt{2\frac{L}{C}}$$

This assumes, of course, that the resistances of other resistors connected to node 107a (resistors 221, 222, 223, and 224 in FIG. 3A) are substantially larger than R. If this is not the case, the equation for R can be modified to account for the other parallel resistances, as will be aparent to one of skill in the art.

In most integrated circuit technologies, capacitance C must remain small, since large capacitors require excessive die area. In the preferred embodiment of the upconverter, the capacitance C of capacitor 229 is 35 pF. The pin inductance L of the low cost DIP packages is typically about 5 nH, as previously mentioned. Thus, in the preferred embodiment, the resistance R of resistor 227 is chosen to be 16 Ohms.

FIG. 7 shows a plot of the impedance to ground of node 107a as a function of frequency for three different resistances R of resistor 227 (capacitance C is 35 pF and inductance L is 5 nH, as above). For good performance of the upconverter chip 101, node 107a must maintain a sufficiently low impedance to ground over the signal frequency range.

In FIG. 7, trace 603 represents the impedance to ground at node 107a (in the preferred embodiment of FIGS. 3A–B)

as a function of frequency. As shown, the preferred values for resistor 227 and capacitor 229 (R=16 Ohms and C=35 pF) in the RF bypass network yeild an impedance characteristic 603 effectively free from undesirable peaking in the signal frequency range. Traces 601 and 602 show the same impedance to ground at node 107a for different resistances R of resistor 227. Trace 601, in which the resistance of resistor 227 is reduced to 5 Ohms, displays an undesirable peak in the impedance to ground at about 380 MHz, e.g., well within the frequency band of interest. Trace 602 shows the effect of increasing the resistance of resistor 227 to 30 Ohms, which is an undesirable increase in the impedance at frequencies above about 500 MHz, also well within the signal band. Thus, the addition of the RF bypass network comprising resistor 227 and capacitor 229 and the selection of appropriate resistance and capacitance in accordance with the invention advantageously mitigates the deleterious effects conventionally caused by the pin inductance of the low cost package. The various RF bypass networks, along with other features of the design including the differential Gilbert type mixer, permit upconverter chip 101 to be encased in the low cost package 600 without substantial performance loss, thereby substantially reducing manufacturing cost.

4.8 Low Distortion AGC

An important function of a receiver is to provide automatic gain control (AGC). The function of the AGC circuit is to adjust the gain of the receiver so that the IF output signal level remains constant with varying RF input signal level. Although the upconverter circuit shown in FIGS. 3A and 3B does not include an AGC circuit, upconverters including such AGC capability may be realized in accordance with the invention by modifying Gilbert type mixer 102 as discussed below.

Conventional AGC circuits often introduce unwanted distortion and although they may be used with the upconverter described above, it is preferable to employ a different ACG circuit which, in accordance with the invention, reduces distortion and is compatible with the Gilbert type mixer.

Conventionally, the AGC function was added to a Gilbert type mixer by replacing source degeneration resistors 253 and 254 (FIG. 3A) with an AGC FET 900 as shown in mixer 102b of FIG. 8. The bias current, supplied by MESFET 226 in FIG. 3A, is supplied instead by two current sources, MESFETs 226a and 226b in FIG. 8, each of which supplies half the total bias current such that no DC bias current flows between the source 901 and drain 902 of the AGC FET 900. AGC FET 900 acts as a voltage-controlled resistor whose resistance $R_{DS}$ between drain 902 and source 901 is a function of the voltage $V_G$ at gate 903. Since the gain of a Gilbert type mixer depends on $R_{DS}$, this gain is controlled by gate voltage $V_G$, thus providing the AGC capability.

Unfortunately, resistance $R_{DS}$ also varies with the RF input signal applied at the gates of MESFETS 255 and 256, leading to the distortion described above. This is true not only for conventional MESFET AGC circuits, but also for conventional bipolar and MOS implementations, both in Silicon and Gallium Arsenide. $R_{DS}$ varies because the varying RF input signal causes the voltage at the source and drain terminals 901 and 902 of AGC FET 900 to vary and $R_{DS}$ depends on both the gate-to-source voltage between gate 903 and source 901 and the drain-to-source voltage between drain 902 and source 901.

FIG. 9 shows the AC equivalent circuit for the AGC FET 900 of a conventional AGC circuit (as shown in FIG. 8). The resistance $R_{DS}$ of AGC FET 900 varies as a function of the gate voltage applied to gate terminal 903 by voltage source 910 and as a function of the small-signal RF input voltage applied accross the gates of MESFETS 255 and 256 of FIG. 8. In FIG. 9, this small-signal RF input voltage is represented by voltage source 115a. Also, MESFETs 255 and 256 of FIG. 8 have been replaced in FIG. 9 by resistors 255a and 256a representing their equivalent impedances, these impedances being the inverse of the transconductances ($g_m$) of MESFETs 255 and 256.

FIG. 10 shows the transfer function for a typical AGC FET such as MESFET 900 in FIG. 9. Trace 911 plots the drain-to-source current $I_{DS}$ flowing through AGC FET 900 as a function of the RF input signal 115a for a fixed, typical gate voltage $V_G$ at terminal 903. Trace 912 shows, for comparison, the transfer function for a hypothetical "ideal" voltage-controlled resistor. The ideal resistor maintains a constant resistance with varying RF input signal voltage (thus the straight transfer characteristic 912). The nonlinear resistance characteristics of conventional AGC circuits, as exhibited for example by trace 911, lead to the previously described distortion problems.

FIG. 10 also illustrates an "odd-symmetric" transfer function 913. In accordance with the invention, a voltage-controlled resistor obeying such an odd-symmetric transfer function is provided and used to construct an AGC circuit which produces only odd order distortion and no (or very little) even order (second, fourth, sixth, etc.) distortion. This assumes, of course, that the zero crossing of the RF input signal 115a occurs at zero volts, which is always true for any Gilbert type mixer because of symmetry. Thus, if the RF input signal $V_{IN}$ was, for example, a single sinusoid, an AGC circuit employing a FET whose drain-to-source resistance obeyed the "odd-symmetric" transfer function 913 in accordance with the invention would generate essentially no odd order distortion products of $V_{IN}$, but only the even order distortion products. The conventional AGC circuit, such as that of FIG. 8 wherein FET 900 has transfer function 911, would generate both even and odd order distortion products.

FIG. 11 shows a circuit structure to realize an AGC FET having a desirable odd-symmetric transfer function, such as trace 913, in accordance with the invention. As shown in FIG. 11, a voltage-controlled variable resistance circuit 950 having an odd-symmetric resistance characteristic between terminals 960 and 970 can be implemented by a circuit using a FET (MESFET, MOSFET, GASFET, etc.) 900 wherein the average of the FET's drain 901 and source 902 voltages is added to the control voltage 910 and applied at the FET's gate 903. This presumes that the FET has nearly identical source and drain geometry, which is generally true of monolithically fabricated MOSFET and MESFET devices. This process of augmenting an input signal voltage by coupling another signal to the input node is commonly termed "bootstrapping." (See, for example, *The Art of Electronics*, 2d Ed. by Horowitz and Hill, Cambridge, Univ. Press. 1989, pp. 96–98.) In accordance with the invention as depicted generally in FIG. 11, bootstrapping circuit 920 provides the bootstrapping which causes the resistance between the source 901 and drain 902 terminals of AGC FET 900 to remain symmetric with respect to the polarity of the voltage across these terminals. Bootstrapping circuit 920, depicted in an "ideal" realization in FIG. 11, adds the average 915 of the source 901 and drain 902 voltages to the control voltage 910 and applies the result to the gate 903 of AGC FET 900. The chapter entitled "Continuous-Time Filters" by Yannis Tsividis (*Design of MOS VLSI Circuits for Telecommunications*, Y. Tsividis and P. Antognetti, Eds., Prentice Hall, Englewood Cliffs, N.J. 1985) describes circuits for improving the linearity of the resistance of FET resistors used in low frequency continuous-time MOS filters—a wholly different problem than that involved here. Although the Tsvidis reference mentions the possibility of a variable resistance circuit, it advocates a substantially different approach than that shown in FIG. 11 and fails to disclose any practical way to realize such a circuit. Moreover, Tsividis is concerned with relatively low frequency circuits unlike the present invention which is directed to RF circuits.

In accordance with the invention, capacitive bootstrapping is used to realize an odd-symmetric variable resistance circuit useful, for example, in a high frequency AGC circuit. FIG. 12 shows a practical embodiment of an odd-symmetric variable resistance circuit 950 in accordance with the invention. In variable resistance circuit 950, bootstrapping circuit 920 comprises capacitors 921 and 922 and resistor 923. Capacitors 921 and 922 have matched capacitances chosen such that their impedance, $1/\omega C$, at the RF signal frequency is much less than the resistance of resistor 923. Also, the RF signal frequency impedance of capacitors 921 and 922 is preferably kept significantly larger than the drain-to-source resistance $R_{DS}$ of AGC FET 900, so as not to simply shunt $R_{DS}$.

Variable resistance circuit 950 operates as follows. The gain control signal $V_G$ applied at terminal 910 has a relatively low frequency at which the impedance of capacitors 921 and 922 is very high. Thus, the low frequency signal at the gate 903 terminal of AGC FET 900 is essentially $V_G$ (as was the case for FET 900 in the conventional AGC circuit of FIG. 9). In accordance with the invention, capacitors 921 and 922 impose an additional signal at the gate terminal 903 equal to the average of the source 901 and drain 902 voltages. The two capacitors act as a capacitive AC voltage divider to achieve this result. The preference that the resistance of resistor 923 be much greater than the impedance of capacitors 921 and 922 (at the RF frequency) assures that the capacitive voltage divider functions in a near ideal manner.

In a CATV upconverter, the preferences relating to the resistance of resistor 923 and the capacitance of capacitors 921 and 922 are easily realized. A preferred embodiment of the CATV upconverter similar to that shown in FIGS. 3A and 3B (but including an AGC circuit using the variable resistance circuit 950 of FIG. 12) uses 25 KOhms for resistor 923 and 1 pF each for capacitors 921 and 922. In this circuit, the resistance $R_{DS}$ between the source 901 and drain 902 terminals of AGC FET 900 varies from about 16 to 120 Ohms, which provides approximately 10 dB of gain control over an RF input frequency range of 50 to 550 MHz.

FIG. 13 shows how a further improvement in the linearity of the AGC circuit may be achieved in accordance with the invention by serially cascading several of the variable resistance circuits 950 (of FIG. 12) to form a composite variable resistance circuit 980. In accordance with the invention, variable resistance circuit 980 provides an odd-symmetric resistance characteristic between terminals 960 and 970, which means that ACG circuits employing variable resistance circuit 980 in place of the conventional AGC FET will produce no (or very little) second order distortion. In variable resistance circuit 980, the overall voltage across the variable resistor (the voltage between terminals 960 and 970) is advantageously distributed among a plurality of FETs. Thus, the drain-to-source voltage of each FET (900a, 900b and 900c in FIG. 13) is reduced. The lower drain-to-source voltages cause FETs 900a, 900b and 900c to behave more linearly than the single AGC FET 900 in FIG. 12, reducing distortion accordingly. The operation of the multiple FET AGC circuit of FIG. 13 is otherwise analogous to that of the single FET AGC circuit of FIG. 12: FETs 900a–c correspond to FET 900; capacitors 921a–c and 922a–c correspond to capacitors 921 and 922, respectively; and resistors 923a–c correspond to resistor 923.

4.9. Rapid Testing

As shown in FIG. 14, each GaAs MESFET 701 is a four terminal device containing a drain terminal 703, a gate terminal 702, a source terminal 704, and a back-gate terminal 705. In nearly all monolithic integrated circuits, the back-gate terminal 705 of every device is connected in manufacture to a semi-insulating (SI) substrate, which in turn connects to a DC supply. During large-signal transient conditions, such as power-up, significant injection of carriers via the back-gate terminals into the SI substrate can lead to anomalous circuit behavior, such as the so-called "hysteresis effect" reported in the previously incorporated articles and other less understood effects.

It was found with one early embodiment of the present upconverter chip that such back-gate transient effects seemed to cause a power-up latency on the order of seconds. While of little significance once the circuit is "warmed up" and in actual use, such a long power-up latency is undesirable since it significantly increases the testing time and hence the manufacturing cost of each chip.

In accordance with the invention, a preferred embodiment of the Upconverter chip includes an improved DC biasing circuit, in which source degeneration resistors 225 and 236 were added for MESFETs 226 and 265 which control the bias current for the mixer 102 and phase splitter 103, respectively. The effect of adding source degeneration resistors 225 and 236 was to reduce the observed power-up latency from seconds to milliseconds, significantly reducing the testing cost of each chip. While source degeneration is conventionally employed to increase output impedance, source degeneration of critical bias current sources may be advantageously employed in accordance with the present invention to substantially reduce the back-gate associated power-up latency in monolithic GaAs integrated circuits.

In accordance with the invention, passive voltage-dividing networks may also be used to bias the gate terminal of MESFET current sources. In FIGS. 3A–B for example, the gate terminals of MESFETs 226 and 265, which function as current sources, are biased by voltage-dividing networks comprising mostly or entirely passive devices, particularly diodes and resistors. In FIGS. 3A–B, the gate voltage of MESFET 226, which biases mixer 102, is set by a passive voltage-dividing network comprising resistors 221, 223 and 224, while the gate voltage of MESFET 265, which biases phase splitter 103, is set by a passive voltage-dividing network comprising resistor 250 and diodes 231, 232, 233, 234, and 235.

It will be evident to those of usual skill in this art that the preferred embodiments, as depicted in the drawings and the specification, represent but a few of the many circuits within the scope of the present invention, which is intended to be limited only in accordance with the following claims.

What is claimed is:

1. A low noise upconverter chip for modulating an RF input signal to a higher frequency IF output signal, said upconverter chip including a mixer circuit in combination with and packaged in a low cost plastic dual inline package having a plurality of pins.

2. An upconverter chip as defined in claim 1, wherein the mixer employs a balanced circuit topology to reduce the sensitivity of the upconverter chip performance to the parasitic inductances of the pins.

3. An upconverter chip as defined in claim 1, wherein the mixer is a Gilbert type image-rejecting mixer for mixing the RF input signal with a LO signal to generate the IF output signal wherein said mixer attenuates signals at the image frequency, thereby reducing noise in the IF output signal contributed by electronic devices producing broadband noise at said image frequency.

4. A low noise upconverter chip for modulating an RF input signal to a higher frequency IF output signal, said upconverter chip including a mixer circuit in combination with and packaged in a low cost plastic dual inline package having a plurality of pins, said upconverter chip including at least one on-chip passive RF bypass network wherein each passive RF bypass network is connected to a pin to dampen the spurious resonance caused by the parasitic inductance of the pin.

5. A low noise upconverter chip for modulating an RF input signal to a higher frequency IF output signal, said upconverter chip including a mixer circuit in combination with and packaged in a low cost plastic dual inline package having a plurality of pins, said upconverter chip further including at least one on-chip passive RF bypass network wherein each said passive RF bypass network is connected to a pin to dampen the spurious resonance caused by the parasitic inductance of the pin, each said passive RF bypass network comprising a capacitor having first and second terminals, wherein the first terminal of the capacitor is connected to an AC ground node in the upconverter chip, and a resistor connected between the second terminal of the capacitor and a pin of the package, with resistance chosen to dampen the spurious resonance caused by the parasitic inductance of the pin.

6. A low noise upconverter chip for modulating an rf input signal to a higher frequency IF output signal, said upconverter chip including a mixer circuit in combination with and packaged in a low cost plastic dual inline package having a plurality of pins, wherein the mixer is a Gilbert type image-rejecting mixer comprising:

a source degenerated first differential pair comprising matched first and second MESFETs, each having source, gate and drain terminals, and matched first and second inductors, wherein the source degenerating element for the first MESFET comprises the first matched inductor and the source degenerating element for the second MESFET comprises the second matched inductor, and the gates of the first and second MESFETs receive the RF input signal; and a second differential pair comprising matched third and fourth MESFETs, each having source, gate and drain terminals, and a third differential pair comprising matched fifth and sixth MESFETs, each having source, gate and drain terminals, wherein the sources of the third and fourth MESFETs connect to the drain of the first MESFET and the sources of the fifth and sixth MESFETs connect to the drain of the second MESFET, the gate of the third MESFET connects to the gate of the fifth MESFET and the gate of the fourth MESFET connects to the gate of the sixth MESFET, the drain of the third MESFET connects to the drain of the sixth MESFET and the drain of the fourth MESFET connects to the drain of the fifth MESFET, the gates of the third and fourth MESFETs receive a differential LO signal and the drains of the third and fourth MESFETs supply the IF output signal.

7. The upconverter chip as defined in claim 6, further comprising:

a phase splitter for generating the differential LO signal from a single-ended LO signal.

8. The upconverter chip as defined in claim 7, further comprising:

a voltage-controlled local oscillator for generating the single-ended LO signal.

9. A low noise upconverter chip for modulating an RF input signal to a higher frequency IF output signal, said upconverter chip including a mixer circuit in combination with and packaged in a low cost plastic dual inline package having a plurality of pins, wherein the mixer is a Gilbert type image-rejecting mixer comprising:

a source degenerated first differential pair comprising matched first and second MESFETs, each having source, gate and drain terminals, and matched first and second inductors, wherein the source degenerating element for the first MESFET comprises the first matched inductor and the source degenerating element for the second MESFET comprises the second matched inductor, and the gates of the first and second MESFETs receive the RF input signal;

a second differential pair comprising matched third and fourth MESFETs, each having source, gate and drain terminals, and a third differential pair comprising matched fifth and sixth MESFETs, each having source, gate and drain terminals, wherein the sources of the third and fourth MESFETs connect to the drain of the first MESFET and the sources of the fifth and sixth MESFETs connect to the drain of the second MESFET, the gate of the third MESFET connects to the gate of the fifth MESFET and the gate of the fourth MESFET connects to the gate of the sixth MESFET, the drain of the third MESFET connects to the drain of the sixth MESFET and the drain of the fourth MESFET connects to the drain of the fifth MESFET, the gates of the third and fourth MESFETs receive a differential LO signal and the drains of the third and fourth MESFETs supply the IF output signal; and first and second matched source-degenerating resistors, where the first resistor is connected in series with the first matched inductor, the serially connected first resistor and first matched inductor being connected between the source of the first MESFET and a virtual ground node, and the second resistor is connected in series with the second matched inductors, the serially connected second resistor and second matched inductor being connected between the source of the second MESFET and the virtual ground node.

10. A low noise upconverter chip for modulating an RF input signal to a higher frequency IF output signal, said upconverter chip including a mixer circuit in combination with and packaged in a low cost plastic dual inline package having a plurality of pins, wherein the mixer is a Gilbert type image-rejecting mixer comprising:

a source degenerated first differential pair comprising matched first and second MESFETs, each having source, gate and drain terminals, and matched first and second inductors, wherein the source degenerating element for the first MESFET comprises the first matched inductor and the source degenerating element for the second MESFET comprises the second matched inductor, and the gates of the first and second MESFETs receive the RF input signal;

a second differential pair comprising matched third and fourth MESFETs, each having source, gate and drain terminals, and a third differential pair comprising matched fifth and sixth MESFETs, each having source, gate and drain terminals, wherein the sources of the third and fourth MESFETs connect to the drain of the first MESFET and the sources of the fifth and sixth MESFETs connect to the drain of the second MESFET, the gate of the third MESFET connects to the gate of the fifth MESFET and the gate of the fourth MESFET connects to the gate of the sixth MESFET, the drain of the third MESFET connects to the drain of the sixth MESFET and the drain of the fourth MESFET connects to the drain of the fifth MESFET, the gates of the third and fourth MESFETs receive a differential LO signal and the drains of the third and fourth MESFETs supply the IF output signal; and gain control means coupled between the matched first and second inductors for varying the gain between the RF signal and the IF signal.

11. An upconverter chip as defined in claim 10, wherein the gain control means comprises an AGC FET, said AGC FET being disposed between the first and second matched inductors and having source, drain and gate terminals, said source terminal being connected to one of the matched inductors and said drain terminal being connected to the other matched inductor so as to provide a variable resistance between said inductors.

12. An upconverter chip as defined in claim 11, wherein the gain control means further comprises:

a gain control terminal resistively coupled to the gate terminal of the AGC FET;

first capacitive means connected between the gate and drain terminals of the AGC FET; and, second capacitive means connected between the gate and source terminals of the AGC FET.

13. An upconverter as defined in claim 12, wherein the resistance between the gain control terminal and the gate terminal of the AGC FET is much larger than the RF signal frequency impedance of the first or second capacitive means.

14. An upconverter chip as defined in claim 12 wherein the capacitance of the first and second capacitive means is matched.

15. A low noise upconverter chip for modulating an RF input signal to a higher frequency IF output signal, said upconverter chip including a mixer circuit in combination with and packaged in a low cost plastic dual inline package having a plurality of pins, said upconverter chip further comprising a fast-settling DC bias circuit for biasing the mixer and reducing power-up latency in the upconverter chip.

16. A low noise upconverter chip for modulating an rf input signal to a higher frequency IF output signal, said upconverter chip including a mixer circuit in combination with and packaged in a low cost plastic dual inline package having of plurality of pins, said upconverter chip further comprising a fast-settling DC bias circuit for biasing the mixer and reducing power-up latency in the upconverter chip, said fast-settling DC bias circuit comprising:

a voltage dividing network including at least one internal node for generating a DC voltage at said internal node; and a current source comprising a MESFET, having source, gate, and drain terminals, wherein the current flowing between source and drain terminals is responsive to the voltage on the MESFET gate terminal and the MESFET gate terminal is connected to said internal node in the voltage dividing network, and the drain terminal of the MESFET is connected to a virtual ground node of the mixer circuit.

17. The upconverter chip as defined in claim 16, wherein the voltage dividing network consists essentially of resistors.

18. The upconverter chip as defined in claim 16, wherein the current source further comprises a source degeneration resistor connected to the source terminal of the MESFET.

19. A Gilbert type image-rejecting mixer for mixing a differential RF signal with a differential LO signal to generate a differential IF signal, said mixer comprising:

a source degenerated first differential pair comprising matched first and second transistors, each having source, gate and drain terminals, and matched first and second inductors, wherein the source degenerating element for the first transistor comprises the first matched inductor and the source degenerating element for the second transistor comprises the second matched inductor, and the gates of the first and second transistors receive the differential RF input signal; and a second differential pair comprising matched third and fourth transistors, each having source, gate and drain terminals, and a third differential pair comprising matched fifth and sixth transistors, each having source, gate and drain terminals, wherein the sources of the third and fourth transistors connect to the drain of the first transistor and the sources of the fifth and sixth transistors connect to the drain of the second transistor, the gate of the third transistor connects to the gate of the fifth transistor and the gate of the fourth transistor connects to the gate of the sixth transistor, the drain of the third transistor connects to the drain of the sixth transistor and the drain of the fourth transistor connects to the drain of the fifth transistor, the gates of the third and fourth transistors receive the differential LO signal and the drains of the third and fourth transistors supply the differential IF signal.

20. A Gilbert type image-rejecting mixer for mixing a different RF signal with a differential LO signal to generate a differential IF signal, said mixer comprising:

a source degenerated first differential pair comprising matched first and second transistors, each having source, gate and drain terminals, and matched first and second inductors, wherein the source degenerating element for the first transistor comprises the first matched inductor and the source degenerating element for the second transistor comprises the second matched inductor, and the gates of the first and second transistors receive the differential RF input signal;

a second differential pair comprising matched third and fourth transistors, each having source, gate and drain terminals, and a third differential pair comprising matched fifth and sixth transistors, each having source, gate and drain terminals, wherein the sources of the third and fourth transistors connect to the drain of the first transistor and the sources of the fifth and sixth transistors connect to the drain of the second transistor, the gate of the third transistor connects to the gate of the fifth transistor and the gate of the fourth transistor connects to the gate of the sixth transistor, the drain of the third transistor connects to the drain of the sixth transistor and the drain of the fourth transistors receive the differential LO signal and the drains of the third and fourth transistors supply the differential IF signal; and gain control means coupled between the matched first and second inductors for varying the gain between the RF signal and the IF signal.

21. A mixer as defined in claim 20, wherein said gain control means comprises an AGC FET being disposed between the first and second matched inductors and having source, drain and gate terminals, said source terminal being connected to one of the matched inductors and said drain terminal being connected to the other matched inductor so as to provide a variable resistance between said inductors.

22. A Gilbert type image-rejecting mixer for mixing a different RF signal with a differential LO signal to generate a differential IF signal, said mixer comprising:

a source degenerated first differential pair comprising matched first and second transistors, each having source, gate and drain terminals, and matched first and second inductors, wherein the source degenerating element for the first transistor comprises the first matched inductor and the source degenerating element for the second transistor comprises the second matched inductor, and the gates of the first and second transistors receive the differential RF input signal;

a second differential pair comprising matched third and fourth transistors, each having source, gate and drain terminals, and a third differential pair comprising matched fifth and sixth transistors, each having source, gate and drain terminals, wherein the sources of the third and fourth transistors connect to the drain of the first transistor and the sources of the fifth and sixth transistors connect to the drain of the second transistor, the gate of the third transistor connects to the gate of the fifth transistor and the gate of the fourth transistor connects to the gate of the sixth transistor, the drain of the third transistor connects to the drain of the sixth transistor and the drain of the fourth transistors receive the differential LO signal and the drains of the third and fourth transistors supply the differential IF signal, wherein the transistors are GaAs MESFETs; and first and second matched source-degenerating resistors, wherein the first resistor is connected in series with the first matched inductor, the serially connected first resistor and first matched inductor being connected between the source of the first MESFET and a virtual ground node, and the second resistor is connected in series with the second matched inductor, the serially connected second resistor and second matched inductor being connected between the source of the second MESFET and the virtual ground node.

23. A monolithic upconverter chip including a gilbert type image rejecting mixer, for mixing a differential RF signal with a differential LO signal to generate a differential IF signal, said mixer comprising:

a source degenerated first differential pair comprising matched first and second transistors, each having source, gate and drain terminals, and matched first and second inductors, wherein the source degenerating element for the first transistor comprises the first matched inductor and the source degenerating element for the second transistor comprises the second matched inductor, and the gates of the first and second transistors receive the differential RF input signal; and a second differential pair comprising matched third and fourth transistors, each having source, gate and drain terminals, and a third differential pair comprising matched fifth and sixth transistors, each having source, gate and drain terminals, wherein the sources of the third and fourth transistors connect to the drain of the first transistor and the sources of the fifth and sixth transistors connect to the drain of the second transistor, the gate of the third transistor connects to the gate of the fifth transistor and the gate of the fourth transistor connects to the gate of the sixth transistor, the drain of the third transistor connects to the drain of the sixth transistor and the drain of the fourth transistor connects to the drain of the fifth transistor, the gates of the third and fourth transistors receive a differential LO signal and the drains of the third and fourth transistors supply the IF output signal.

24. A monolithic upconverter chip as defined in claim 23, further comprising a phase splitter for generating the differential LO signal from a single-ended LO signal.

25. A monolithic upconverter chip as defined in claim 24, further comprising a voltage-controlled local oscillator for generating the single-ended LO signal.

* * * * *